US008717801B2

(12) United States Patent
Maejima et al.

(10) Patent No.: US 8,717,801 B2
(45) Date of Patent: May 6, 2014

(54) SEMICONDUCTOR MEMORY DEVICE

(75) Inventors: Hiroshi Maejima, Tokyo (JP); Koji Hosono, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 345 days.

(21) Appl. No.: 13/195,417

(22) Filed: Aug. 1, 2011

(65) Prior Publication Data

US 2012/0039110 A1    Feb. 16, 2012

(30) Foreign Application Priority Data

Aug. 11, 2010  (JP) .................................. 2010-179893

(51) Int. Cl.
*G11C 11/00*    (2006.01)
(52) U.S. Cl.
USPC .......................................... 365/148; 365/100
(58) Field of Classification Search
USPC .................................................. 365/148, 100
See application file for complete search history.

(56) References Cited

U.S. PATENT DOCUMENTS 6,661,729 B2 * 12/2003 Yamasaki ...................... 365/226
7,697,317 B2    4/2010 Shimaoka et al.
7,986,575 B2 * 7/2011 Inaba ............................. 365/200
2010/0091551 A1    4/2010 Hosono et al.
2010/0232199 A1    9/2010 Maejima

FOREIGN PATENT DOCUMENTS

| JP | 2006-344349 | 12/2006 |
| JP | 2010-92568 A | 4/2010 |
| JP | 2012-504839 A | 2/2012 |
| WO | WO 2010/042316 A1 | 4/2010 |

OTHER PUBLICATIONS

Japanese Office Action issued Apr. 30, 2013 in Patent Application No. 2010-179893 (English Translation only).

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A memory-cell array that includes a first line, a second line intersecting the first line, and a memory cell including a variable resistive element provided in the intersection of the first and the second lines; a data-write unit configured to apply a voltage pulse to the memory cell through the first and the second lines, the voltage pulse to set and/or reset data; and a detector unit configured to compare a cell current that flows through the memory cell by the voltage pulse at the time of setting and/or resetting the data with a reference current generated from the initial value of the cell current, and to control the data-write unit in accordance with a result of comparison.

19 Claims, 18 Drawing Sheets

F I G. 2
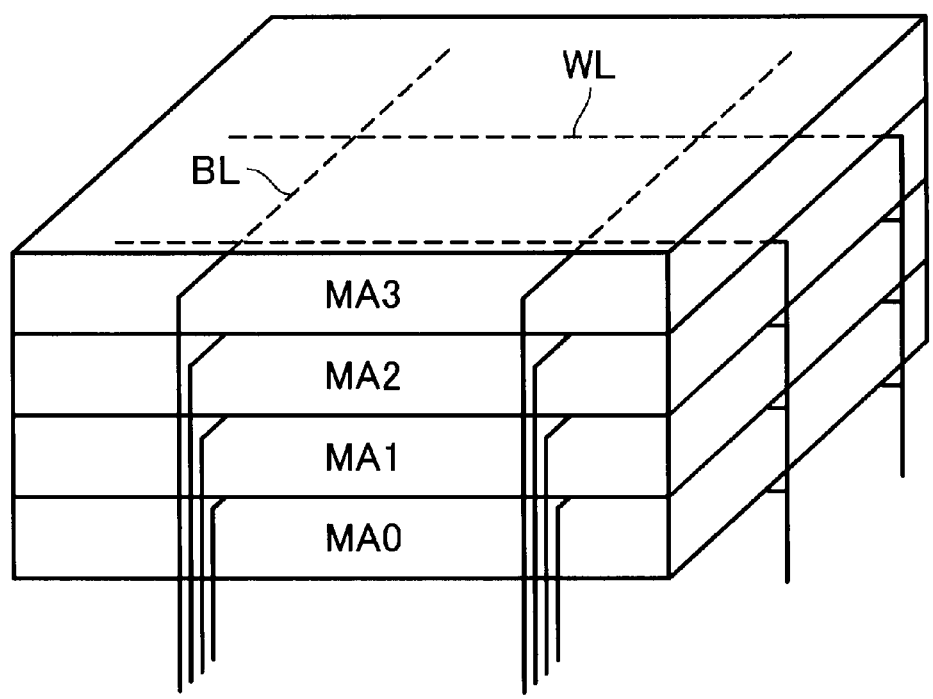
F I G. 3
|  | Voltage [V] | Current [uA] |
|---|---|---|
| Set | 4 | <0.3 |
| Reset | 3 | <3 |
| Read | 2 | <1 |

F I G. 4A
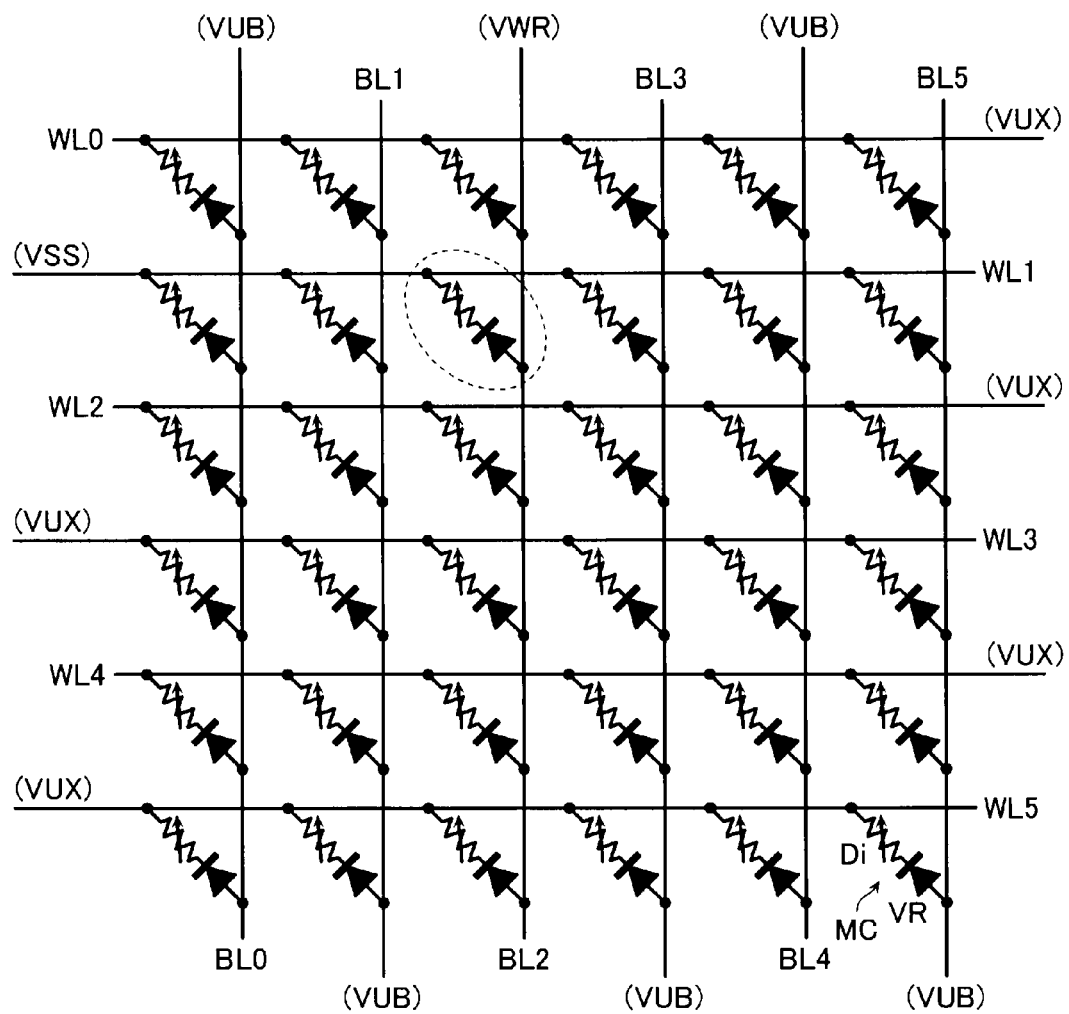

MAIN Row decoder

Row Driver

WDRV Driver

VWR Generator

VUX Generator

Column decoder y=<127:0>

Column Driver

VUB Generator

SEMICONDUCTOR MEMORY DEVICE

CROSS-REFERENCE TO RELATED APPLICATIONS

This application is based upon and claims the benefit of priority from the prior Japanese Patent Application No. 2010-179893, filed Aug. 11, 2010, the entire contents of which are incorporated herein by reference.

BACKGROUND OF THE INVENTION

1. Field of the Invention

The present invention relates to a semiconductor memory device.

2. Description of the Related Art

Flash memories have conventionally been known as electrically alterable non-volatile memories. A flash memory includes a memory cell array formed of NAND-connected or NOR-connected memory cells each having a floating gate structure. Ferroelectric memories are also known as non-volatile memories allowing high random access.

Resistive switching memories using variable-resistive elements in memory cells are proposed as a technique to further miniaturize the memory cells. Some of known variable-resistive elements are: a phase-change memory element that changes the resistance by switching a chalcogenide compound between the crystalline state and the amorphous state; an MRAM element that uses the tunnel magnetoresistance effect to change the resistance; a memory element of polymer ferroelectric RAM (PFRAM) whose resistive element is made of a conductive polymer; and a ReRAM element that changes the resistance with supply of voltage pulse (see, for instance, Japanese Patent Application Publication No. 2006-344349).

However, since a memory cell using a ReRAM element has an inherent instability, simply supply of voltage pulse sometimes fails to cause a resistance change of the memory cell, or sometimes causes a resistance change thereof in a direction reverse to an intended direction. If such resistance change in the reverse direction is left uncontrolled, adverse effects may occur such as a shorter service life of the memory cell.

BRIEF SUMMARY OF THE INVENTION

A semiconductor memory device according to an aspect of the present invention includes: a memory-cell array that includes a first line, a second line intersecting the first line, and a memory cell including a variable resistive element provided in the intersection of the first and the second lines; a data-write unit configured to apply a voltage pulse to the memory cell through the first and the second lines, the voltage pulse to set and/or reset data; and a detector unit configured to compare a cell current that flows through the memory cell by the voltage pulse at the time of setting and/or resetting the data with a reference current generated from an initial value of the cell current, and to control the data-write unit in accordance with a result of comparison.

BRIEF DESCRIPTION OF THE SEVERAL VIEWS OF THE DRAWINGS

FIG. 2 is a perspective view illustrating an example of the configuration of the memory-cell array included in the semiconductor memory device according to the embodiment.

FIG. 3 is a table showing the voltages and the currents applied to the memory cells of the semiconductor memory device according to the embodiment.

FIG. 4A is a diagram showing the voltages applied to the memory-cell array of the semiconductor memory device according to the embodiment.

DETAILED DESCRIPTION OF THE INVENTION

Figure 1:
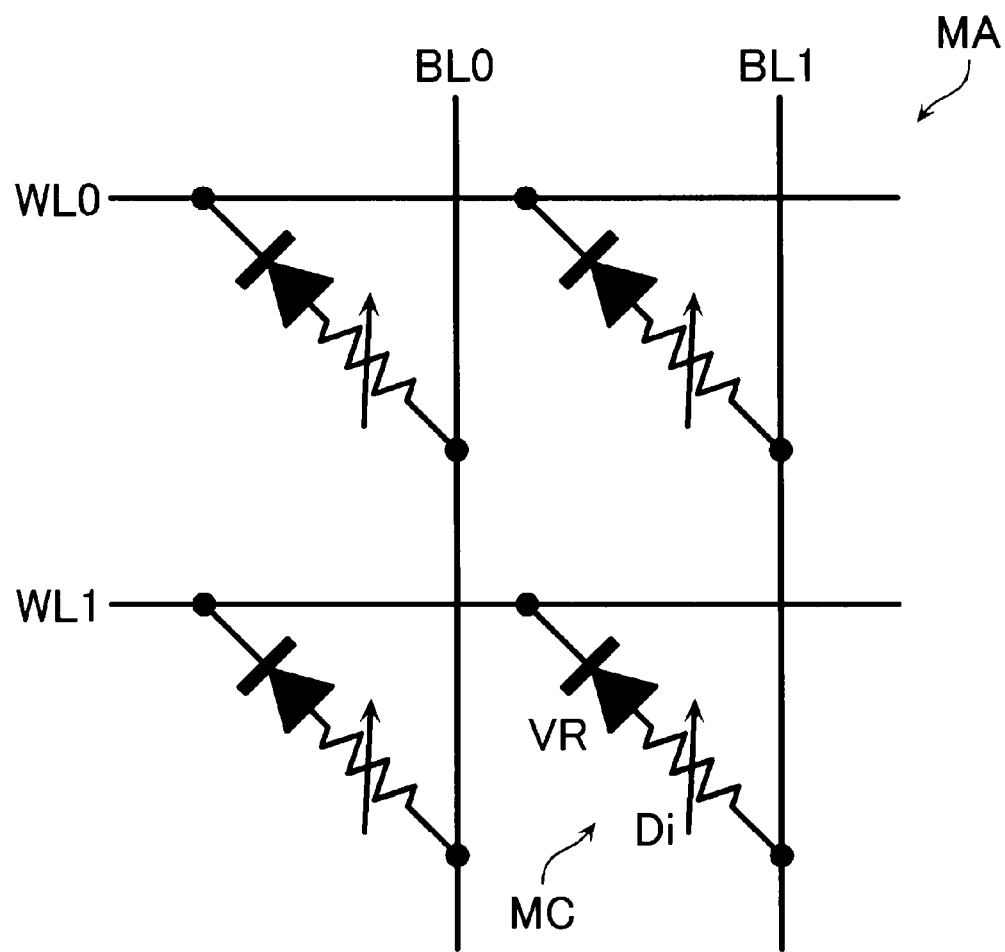
FIG. 1 is a diagram illustrating a memory-cell array included in a semiconductor memory device according to an embodiment.

A semiconductor memory device according to an embodiment is described below by referring to the drawings.

[Embodiment]
<General Configuration of Memory Cell>

Firstly, description is given of the general configuration of a memory cell used in the semiconductor memory device according to the embodiment.

FIG. 1 is a diagram illustrating a portion of a memory-cell array MA. As FIG. 1 shows, the memory-cell array MA includes: a plurality of first lines, that is, word lines WL (specifically, word lines WL0 and WL1 in FIG. 1); and a plurality of second lines, that is, bit lines BL (specifically, bit lines BL0 and BL1 in FIG. 1), that intersects the first lines; and memory cells MC each having a variable resistive element VR. The variable resistive elements are connected respectively to the intersections of the word lines WL and the bit lines BL.

An example of the element used as the variable resistive element VR is a ReRAM having a structure of an electrode/a binary, ternary, or the like metal oxide/an electrode. The memory cells employing the variable resistive element VR can be roughly classified into two types that are different in their respective operations.

A first type is bipolar memory cells MC, in each of which the state of the variable resistive element VR is made to transition between the high resistance state and the low resistance state by changing the polarity of the voltage to be applied to the memory cell MC. Each bipolar memory cell MC includes a variable resistive element VR and a transistor.

A second type is unipolar memory cells MC, in each of which the state of the variable resistive element VR is made to transition between the high resistance state and the low resistance state by controlling both a level of a voltage to be applied to the memory cell MC and a time period of the voltage application. For instance, as FIG. 1 shows, each unipolar memory cell MC includes a variable resistive element VR and a rectifier element such as a diode Di.

Of the memory cells MC of the above-described two types, the unipolar memory cell MC is more favorable than the bipolar memory cell MC in view of the integration of the semiconductor memory device. This is because a unipolar memory cell MC can be formed in the intersecting portion of a word line WL and a bit line BL by stacking a variable resistive element VR and a rectifier element such as a diode Di one upon the other. Consequently, the memory-cell array MA thus formed has a minimum size of 4F2 per cell.

In addition, as FIG. 2 shows, plural memory-cell arrays MA can be stacked one upon another to form a three-dimensional structure. Thus, even higher integration is possible without increasing the area occupied by the memory-cell arrays.

Next, description is given of both the operation to write data into a unipolar memory cell MC and the operation to read data from a unipolar memory cell MC.

The data-write operation includes a set operation and a reset operation. The set operation makes the state of the variable resistive element VR transition from the high-resistance state to the low-resistance state, whereas the reset operation makes the state of the variable resistive element VR transition from the low-resistance state and the high-resistance state.

Firstly, in the set operation, as shown in the top row in FIG. 3, a voltage pulse with a voltage of approximately 4 V and a current of approximately several hundred to several tens of nanoamperes (e.g., smaller than 0.3 µA) is applied to the variable resistive element VR for a period of approximately several tens of nanoseconds to one microsecond (hereinafter such a voltage pulse is also referred to as the "set pulse"). Hence, the state of the variable resistive element VR transitions from the high-resistance state to the low-resistance state. The transition happens in various ways depending upon the material that variable resistive element VR is made of. For instance, it is conceivable that the application of a high voltage causes migration of positively-charged ions in the variable resistive element VR, and thus the material in the isolated state undergoes a phase change to an electrochemical potentially (meta-) stable series-connected state of conductive materials.

Subsequently, in the reset operation, as shown in the middle row in FIG. 3, a voltage pulse with a voltage of approximately 3 V and a current of approximately one micro ampere to ten micro amperes (e.g., smaller than 3 µA) is applied to the variable resistive element VR for a period of approximately several microsecond (hereinafter such a voltage pulse is also referred to as the "reset pulse"). Hence, the state of the variable resistive element VR transitions from the low-resistance state to the high-resistance state. A possible reason for this transition is that the application of the voltage pulse generates Joule heat in the variable resistive element VR and the Joule heat causes thermal diffusion of atoms to restore the original thermal equilibrium state.

In the data-read operation, as shown in the bottom row in FIG. 3, a voltage pulse with a voltage of approximately 2 V is applied to the variable resistive element VR. Then, by monitoring the current flowing through the resistive element, a judgment is made whether the variable resistive element VR is in the low-resistance state or in the high-resistance state.

In the following description, the state of a memory cell MC having the variable resistive element VR in the low-resistance state is also referred to as a "set state," whereas In contrast, the state of a memory cell MC having the variable resistive element VR in the high-resistance state is also referred to as a "reset state." In addition, a "set direction" denotes a direction of the transition of a variable resistive element VR from the high-resistance state to the low-resistance state, whereas a "reset direction" denotes a direction of the transition of a variable resistive element VR from the low-resistance state to the high-resistance state. Accordingly, in the set operation, the set direction is the "forward direction" whereas the reset direction is the "reverse direction." In contrast, in the reset operation, the reset direction is the "forward direction" whereas the set direction is the "reverse direction."

Next, description is given of the bias state of the memory cell MC in the data-write operation.

Figure 4B:
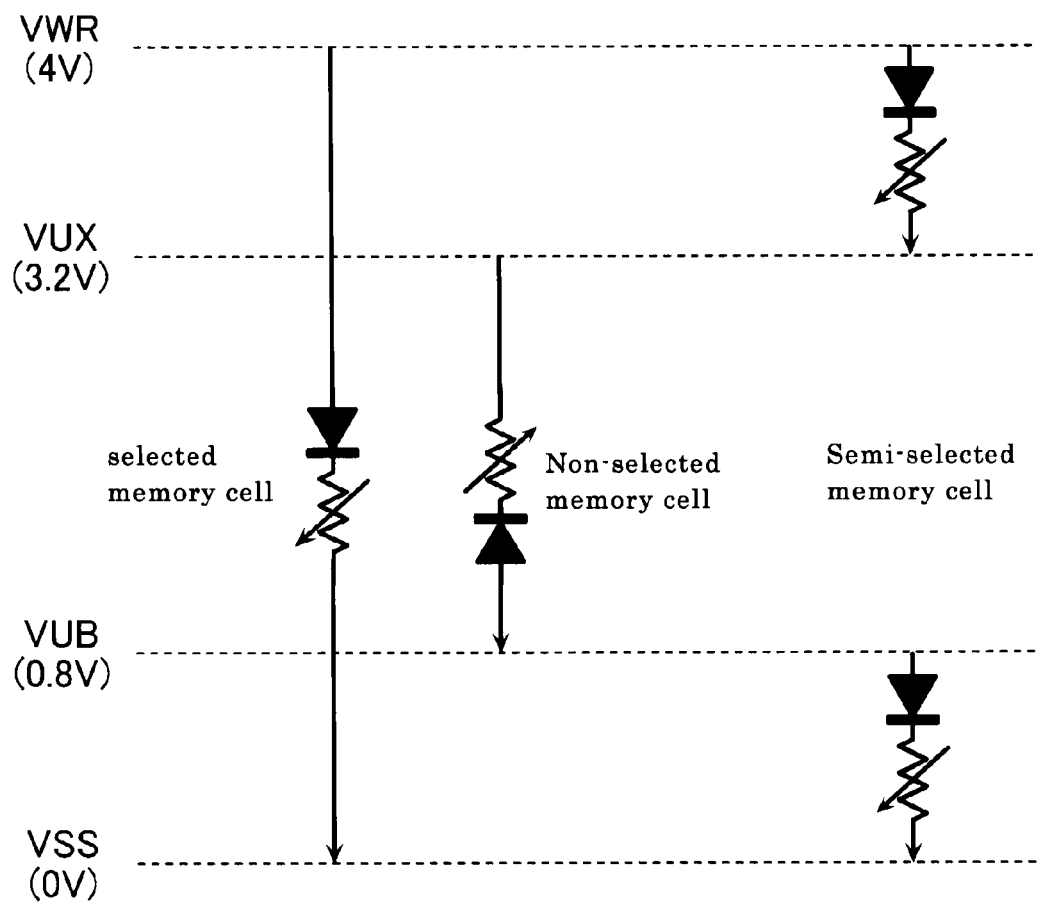
FIG. 4B is a diagram describing the bias state of the memory cells in FIG. 4A.

FIG. 4A shows examples of the voltages applied to the word lines WL and the bit lines BL in the data-write operation. FIG. 4B shows the bias states of the memory cells MC shown in FIG. 4A.

The following description assumes that the word line WL1 is the selected word line, the bit line BL2 is the selected bit lines, the memory cell MC indicated by the dashed-line circle in FIG. 4A is the selected memory cell, and a data-write operation is performed on the selected memory cell MC.

When a data-write operation is performed in the case of FIGS. 4A and 4B, a selected-word-line voltage VSS (e.g., 0 V) is applied to the selected word line WL1, a non-selected-word-line voltage VUX (e.g., 3.2 V) is applied to the non-selected word line WL, a write voltage VWR in the data-write operation (e.g., 4 V in the set operation) is applied to the selected bit line BL2, and a non-selected bit-line voltage VUB (e.g., 0.8 V) is applied to the non-selected bit line BL As shown in the left side of FIG. 4B, a bias "VWR-VSS" in the forward direction of the diode Di is exerted on the selected memory cell MC. The bias functions as a voltage pulse and causes the transition of the state of the selected memory cell MC.

As shown in the middle of FIG. 4B, a bias "VUX-VUB" in the reverse direction of the diode Di is exerted on the non-selected memory cell MC connected to both the non-selected word line WL and the non-selected bit line BL. Hence, voltage pulse is not applied to the variable resistive element VR of this non-selected memory cell MC. Consequently, transition of the state of this non-selected memory cell MC is not caused.

As shown in the upper right side of FIG. 4B, a bias "VWR-VUX" in the forward direction of the diode Di is exerted on the non-selected memory cell MC connected to both the selected bit line BL2 and the non-selected word line WL (hereinafter, a non-selected memory cell connected in a similar way is referred to as a "semi-selected memory cell"). This bias is not enough to perform data-write operation, so that transition of the state of the semi-selected memory cell MC is not caused.

Likewise, as shown in the lower right side of FIG. 4B, a bias "VUB-VSS" in the forward direction of the diode Di is exerted also on the semi-selected memory cell MC connected to both the non-selected bit line BL and the selected word line WL1. This bias is not enough to perform data-write operation, so that transition of the state of the semi-selected memory cell MC is not caused.

In theory, such bias states of the memory cells MC enable the data-write operation to be carried out. In practice, however, it is sometimes impossible to cause the transition of the state of each memory cell MC to be caused as intended.

Note that a memory cell MC becomes in the set state with the flow of a higher cell current than the threshold level used to determine whether or not a memory cell MC is in the set state. In contrast, a memory cell MC becomes in the reset state with the flow of a lower cell current than the threshold level used to determine whether or not a memory cell MC is in the reset state.

In some cases, however, even if a reset pulse is applied to a memory cell MC in the set state in order to make the memory cell MC carry out a reset operation, the state of the memory cell MC does not readily transition to the reset state. There are even such cases where the application of a reset pulse to a memory cell MC in the set state causes the state of the memory cell MC to transition in the set direction (hereinafter, the transition in the set direction of the state of a memory cell MC at the time of a reset operation is also referred to as a "over-set operation").

Likewise, in some other cases, even if a set pulse is applied to a memory cell MC in the reset state in order to make the memory cell MC carry out a set operation, the state of the memory cell MC does not readily transition to the set state. There are even such cases where the application of a set pulse to a memory cell MC in the reset state causes the state of the memory cell MC to transition in the reset direction (hereinafter, the transition in the reset direction of the state of a memory cell MC at the time of a set operation is also referred to as a "over-reset operation").

If level of the over-set operation or the over-reset operation progresses is too large, it is difficult to carryout no further set/reset operation, and the memory cell MC may even be broken.

Hence, the semiconductor memory device according to the embodiment detects an over-set operation and an over-reset operation, and thereby prevents the state of each memory cell MC from falling into a limit area.

<Configuration of Semiconductor Memory Device>

Figure 5:
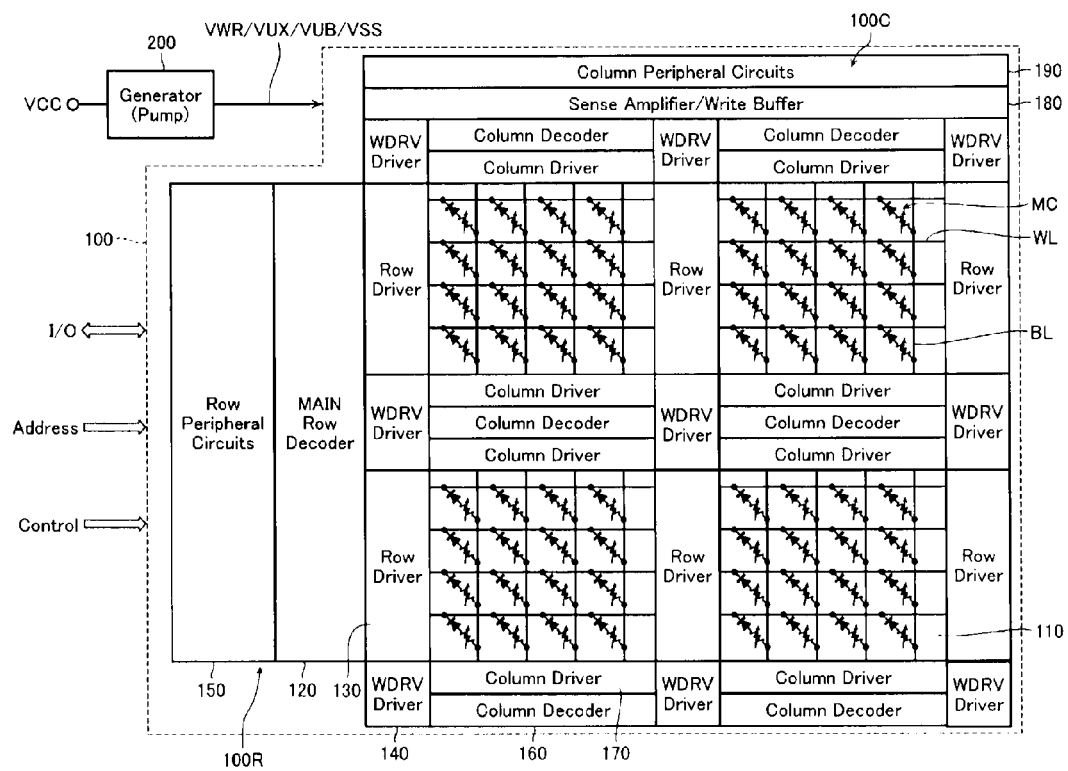
FIG. 5 is a block diagram of the semiconductor memory device according to the embodiment.

FIG. 5 is a block diagram of the semiconductor memory device according to the embodiment.

The semiconductor memory device includes a memory-cell-array core unit 100, which is demarcated by the dashed lines in FIG. 5, and a voltage-generation circuit 200 configured to generate and supply voltages to be used by the memory-cell-array core unit 100.

The memory-cell-array core unit 100 includes a memory-cell array 110, a row-system controller circuit 100R, and a column-system controller circuit 100C. The row-system controller circuit 100R and the column-system controller circuit 100C select memory cells MC on the basis of address signals (Address) and control signals (Control) supplied from the outside, and make the selected memory cells MC to perform a data-write or data-read operation. The voltage-generation circuit 200 includes both a row-system voltage-generation circuit configured to generate voltages to be used by the row-system controller circuit 100R, and a column-system voltage-generation circuit configured to generate voltages to be used by the column-system controller circuit 100C. The row-system controller circuit 100R and the column-system controller circuit 100C together function as a data-write unit when a data-write operation is carried out.

Firstly, description is given of a row-system circuit including both the row-system controller circuit 100R and the row-system voltage-generation circuit. Note that the case to be described below concerns a circuit of hierarchical word-line circuit type that employs main word lines MWL and word lines WL to select memory cells MC in the row direction.

The row-system controller circuit 100R includes a main row decoder 120, a write-drive-line (WDRV) driver 140, and a row driver 130. The main row decoder 120 selects a main word line MWL on the basis of a row address. The write-drive-line (WDRV) driver 140 selects a particular word line WL from the plural word lines WL selected by the main word line MWL that the main row decoder 120 selects. On the basis of the selection made by the main row decoder 120 and the write-drive-line driver 140, the row driver 130 supplies either a selected-word-line voltage VSS or a non-selected-word-line voltage VUX to each of the word lines WL. In addition, the row-system controller circuit 100R includes row-system peripheral circuits 150 that include other circuits needed for the control of the row system. These constituents are described below.

Firstly, description is given of the main row decoder 120.

Figure 6:
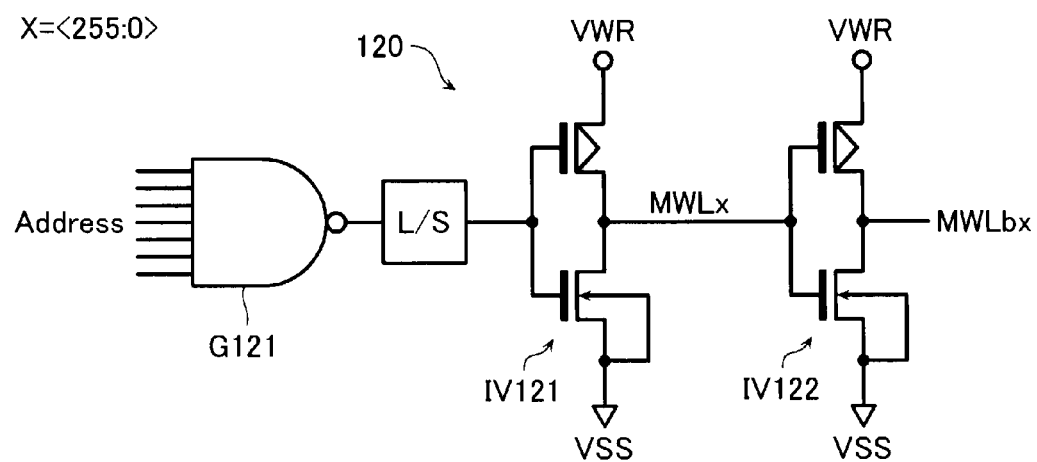
FIG. 6 is a circuit diagram of a row-system circuit of the semiconductor memory device according to the embodiment.

FIG. 6 is a circuit diagram of the main row decoder 120. The main row decoder 120 is a predecoder. The main row decoder 120 selects one pair of 256 pairs of main word lines MWLx (x=<255:0>) and MWLbx. The main row decoder 120 includes a circuit shown in FIG. 6 for each pair of the 256 pairs of the main word lines MWLx and MWLbx. As shown in FIG. 6, the main row decoder 120 includes a NAND gate G121, a level shifter L/S, an inverter IV121, and an inverter IV122. The NAND gate G121 receives an address signal (Address). The level shifter L/S shifts the level of output from the NAND gate G121. The inverter IV121 is provided between a VWR terminal to which a write voltage VWR is supplied and a VSS terminal to which a selected-word-line voltage VSS is supplied, and receives the output from the level shifter L/S. The inverter IV122 is provided between a VWR terminal and a VSS terminal, and receives the output from the inverter IV121. Note that the outputs of the inverters IV121 and IV122 are connected to the corresponding main word lines MWLx and MWLbx, respectively.

The main row decoder 120 selects certain x based on the address signal (Address) to supply the voltages VSS and VWR to the selected word lines MWLx and MWLbx, respectively, as well as to supply the voltages VWR and VSS to the non-selected word lines MWLx and MWLbx, respectively.

Subsequently, a description is given of the row drivers 130.

Figure 7:
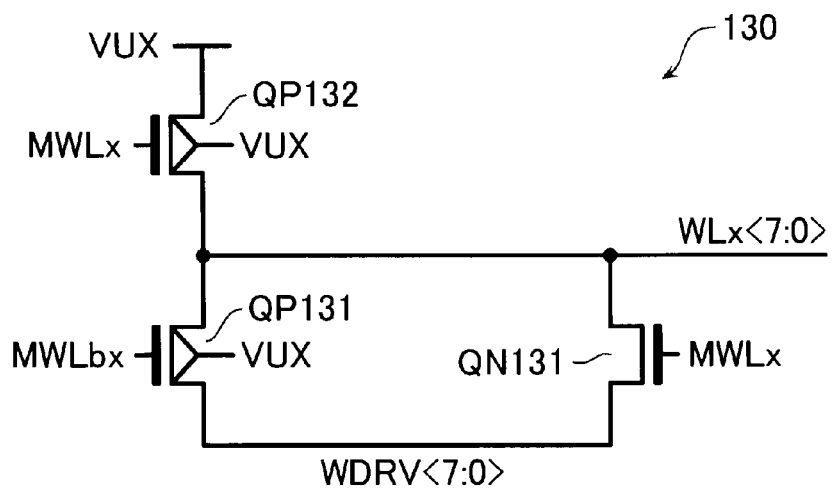
FIG. 7 is a circuit diagram of a row-system circuit of the semiconductor memory device according to the embodiment.

FIG. 7 is a circuit diagram of each row driver 130. The row driver 130 receives one pair of the 256 pairs of the main word lines MWLx (x=<255:0>) and MWLbx. Eight row drivers 130 are provided per main row decoder 120. As shown in FIG. 7, each row driver 130 includes: two transistors QP131 and QN131 which are provided between write drive lines WDRV <7:0> and the word lines WLx <7:0> and are respectively controlled by the main word lines MWLbx and MWLx; and a transistor QP132 which is provided between a VUX line to which the non-selected-word-line voltage VUX is supplied and the word line WLx <7:0>, the transistor QP132 controlled by the main word line MWLx.

The row driver 130 connects the word line WLx <7:0> with either the write drive line WDRV <7:0> or the VUX line, depending on the selected/non-selected state of the main word line MWLx. Thereby, the word line WLx <7:0> is supplied with either the voltage VSS or the voltage VUX.

Next, a description is given of the write-drive-line driver 140.

Figure 8:
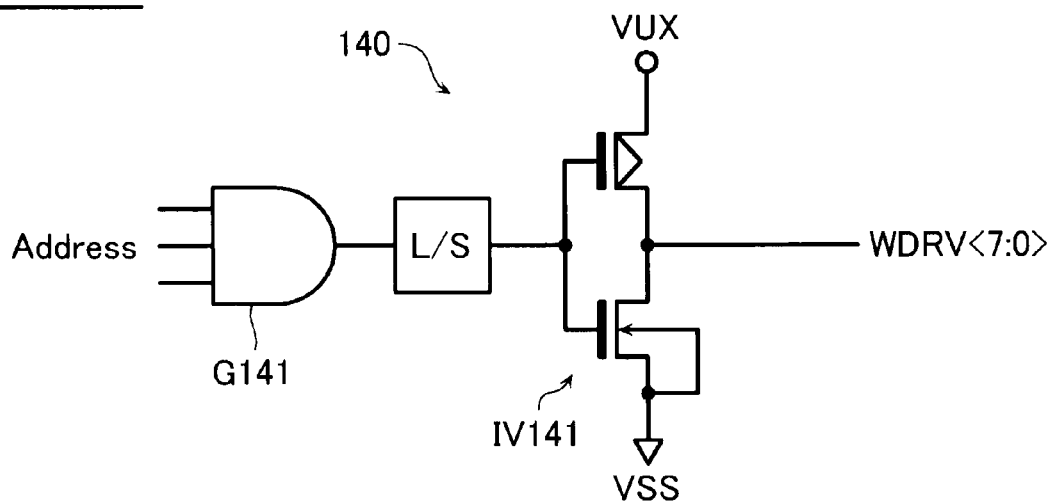
FIG. 8 is a circuit diagram of a row-system circuit of the semiconductor memory device according to the embodiment.

FIG. 8 is a circuit diagram of the write-drive-line driver 140. The write-drive-line driver 140 is a predecoder. The write-drive-line driver 140 includes an AND gate G141, a level shifter L/S, and an inverter IV141. The AND gate G141 receives an address signal (Address). The level shifter L/S shifts the level of output from the AND gate G141. The inverter IV141 receives the output from the level shifter L/S which is provided between the VSS terminal and the VUX terminal to which the non-selected-word-line voltage VUX is supplied.

The write-drive-line driver 140 supplies the write drive line WDRV <127:0> corresponding to the inputted address with the selected-word-line voltage VSS, and supplies another write drive line WDRV <127:0> with the non-selected-word-line voltage VUX. The voltages for the write drive lines WDRV are supplied to the word lines WLx through the row driver 130.

Next, description is given of a write-voltage generator circuit 210 configured to generate a write voltage VWR to be supplied to the main row decoder 120. The write-voltage generator circuit 210 is included in the voltage-generation circuit 200.

Figure 9:
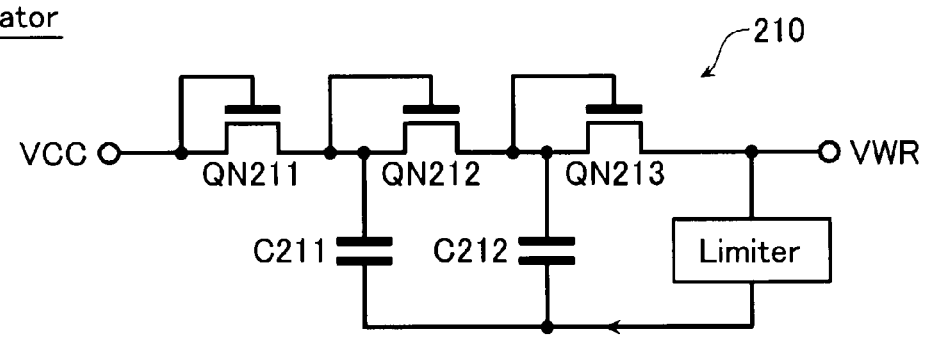
FIG. 9 is a circuit diagram of a row-system circuit of the semiconductor memory device according to the embodiment.

FIG. 9 is a circuit diagram of the write-voltage generator circuit 210. The write-voltage generator circuit 210 includes three transistors QN211 to QN213 connected in series to one another between a VCC terminal, to which an external source voltage VCC is inputted, and a VWR terminal, from which a write voltage VWR generated by the write-voltage generator circuit 210 is outputted. Each of the three transistors QN211 to QN213 is connected as a diode with the VCC terminal side being the anode and the VWR-terminal side being the cathode. The write-voltage generator circuit 210 also includes capacitors C211 and C212, each of which has an end connected to the drain sides of the transistors QN211, QN212, and QN213. The other ends of the capacitors C211 and C212 are connected to each other. The write-voltage generator circuit 210 further includes a limiter circuit (Limiter).

The write-voltage generator circuit 210 accumulates, in the capacitor C211, the charges supplied from the external source voltage VCC. In addition, the write-voltage generator circuit 210 accumulates, in the capacitor C212, these charges and the charges supplied from the external source voltage VCC in a superposed manner. By discharging the charges accumulated in the capacitor C212, the write voltage VWR that is higher than the external source voltage VCC can be obtained. Note that the output of the write-voltage generator circuit 210 is constrained by the limiter circuit so as to be less than the write voltage VWR.

Next, description is given of a non-selected word-line-voltage generator circuit 220 configured to generate a non-selected-word-line voltage VUX to be supplied to the write-drive-line driver 140.

Figure 10:
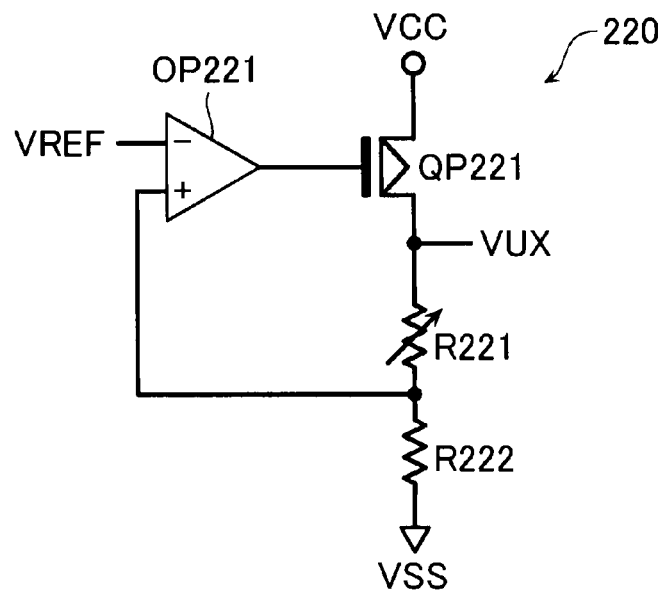
FIG. 10 is a circuit diagram of a row-system circuit of the semiconductor memory device according to the embodiment.

FIG. 10 is a circuit diagram of the non-selected word-line-voltage generator circuit 220. The non-selected word-line-voltage generator circuit 220 includes a PMOS transistor QP221, a variable resistor R221, and a fixed resistor R222, which are connected in series to one another between a VCC terminal and a VSS terminal. In addition, the non-selected word-line-voltage generator circuit 220 includes an operational amplifier OP221. The voltage of the connection point of the resistors R221 and R222 is inputted into the non-inverting input terminal of the operational amplifier OP221 whereas a predetermined reference voltage VREF used in the generation of the non-selected-word-line voltage VUX is inputted into the non-inverting input terminal of the operational amplifier OP221. The output of the operational amplifier OP221 is inputted into the gate of the transistor QP221. In the non-selected word-line-voltage generator circuit 220, a constant-voltage circuit is formed with the components described above, and a non-selected-word-line voltage VUX is generated at the connection node of the transistor QP221 and the variable resistor R221.

With the row-system circuit that has the above-described configuration, the selected-word-line voltage VSS is supplied only to the word lines WLx selected on the basis of the address signals while a non-selected-word-line voltage VUX is supplied to the other word lines WL.

Next, description is given of a column-system circuit including both the column-system controller circuit 100C and the column-system voltage-generation circuit.

The column-system controller circuit 100C includes a column decoder 160, a column driver 170, and a sense amplifier/write buffer 180. The column decoder 160 selects a column selection line CSL on the basis of the address signals of the column selection line CSL. The column driver 170 supplies either the write voltage VWR or the non-selected bit-line voltage VUB to the bit lines BL through the column selection line CSL selected by the column decoder 160. The sense amplifier/write buffer 180 is configured to apply, to the column driver 170, a large enough voltage pulse to carry out a data-write operation. The sense amplifier/write buffer 180 is configured also to detect data read from the memory cells MC. In addition, the column-system controller circuit 100C includes column-system peripheral circuits 190 that include other circuits needed for the control of the column system. In the following paragraphs, each of these constituent elements is described.

Firstly, a description is given of the column decoders 160.

Figure 11:
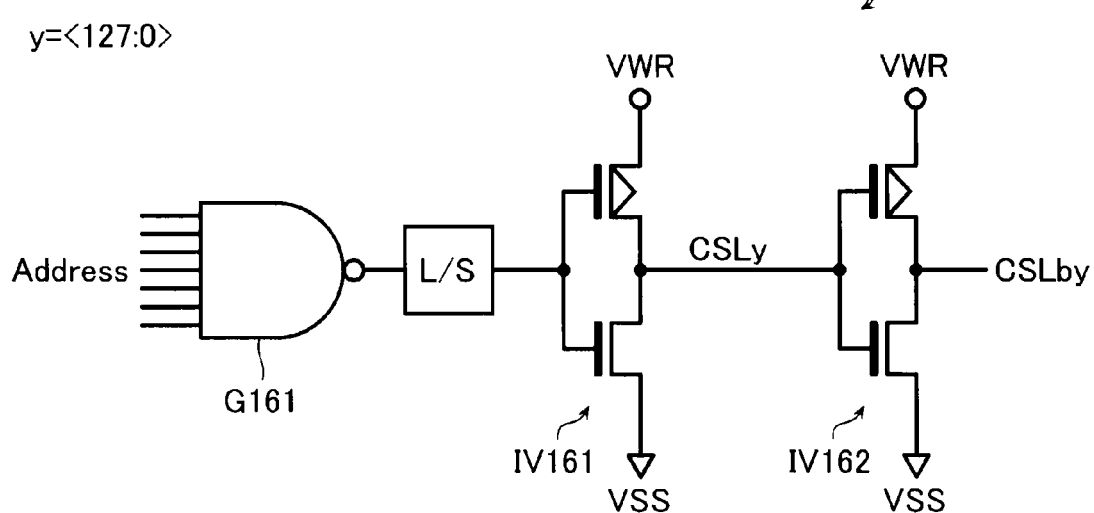
FIG. 11 is a circuit diagram of a column-system circuit of the semiconductor memory device according to the embodiment.

FIG. 11 is a circuit diagram of each column decoder 160. The column decoder 160 receives a column address to select one pair of 128 pairs of a column selection line CSLy (y=<127:0>) and a column selection line CSLby. Note that the column decoder 160 includes a circuit shown in FIG. 11 for each pair of the 128 pairs of the column selection lines CSLy and CSLby. The column decoder 160 includes a NAND gate G161, a level shifter L/S, an inverter IV161, and an inverter IV162. The NAND gate G161 receives an address signal (Address). The level shifter L/S shifts the level of output from the NAND gate G161. The inverter IV161 is provided between the VWR terminal and the VSS terminal, and receives the output from the level shifter L/S. The inverter IV162 is provided between the VWR terminal and the VSS terminal, receives the output from the inverter IV161. Note that the outputs of the inverters IV161 and IV162 are connected to the corresponding column selection lines CSLy and CSLby, respectively.

The column decoder 160 selects a y on the basis of the address signal. Then, the column decoder 160 supplies voltages VWR and VSS respectively to the selected column selection lines CSLy and CSLby. In addition, the column decoder 160 supplies voltages VSS and VWR respectively to the non-selected column selection lines CSLy and CSLby.

Next, a description is given of the column drivers 170.

Figure 12:
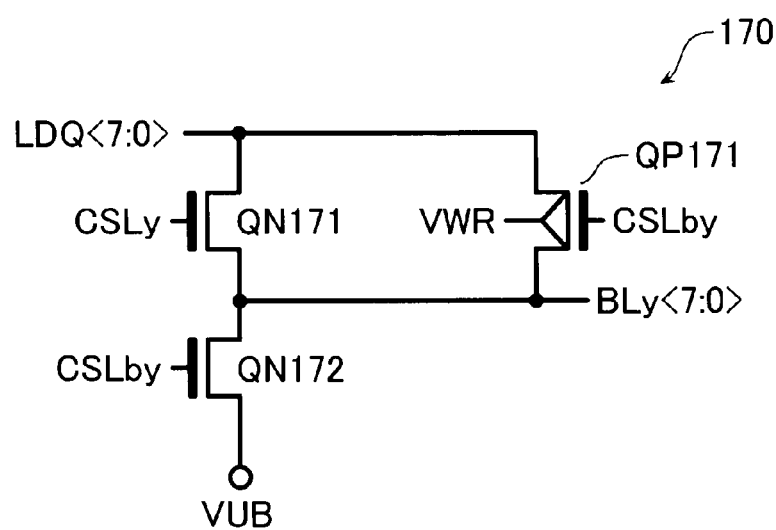
FIG. 12 is a circuit diagram of a column-system circuit of the semiconductor memory device according to the embodiment.

FIG. 12 is a circuit diagram of each column driver 170. The column driver 170 receives one pair of the 128 pairs of column selection lines CSLy (y=<127:0>) and CSLby. Eight column drivers 170 are provided per column decoder 160. As shown in FIG. 12, each column driver 170 includes: two transistors QN171 and QP171 which are provided between local data lines LDQ <7:0> and the bit lines BLy <7:0> and are respectively controlled by the column selection lines CSLy and CSLby; and a transistor QN172 which is provided between the VUB terminal to which the non-selected-bit-line voltage VUB is supplied and the bit lines BLy <7:0>, the transistor QN172 controlled by the column selection line CSLby.

The column driver 170 connects the bit line BLy with either the local data lines LDQ <7:0> or the power lines of the non-selected-bit-line voltage VUB, depending on the selected/non-selected state of the column selection line CSLy. Note that the voltage of the local data lines LDQ <7:0> is either the write voltage VWR or the non-selected-bit-line voltage VUB supplied from the sense amplifier/write buffer 180. Thereby, the bit lines BLy <7:0> are supplied with either the write voltage VWR or the non-selected-bit-line voltage VUB.

With the column decoder 160 and the column driver 170, a write voltage VWR is supplied to the bit lines Bly selected on the basis of the address signals. In addition, a non-selected bit-line voltage VUB is supplied to the other bit lines Bly.

Next, a description is given of the sense amplifier/write buffer 180.

Figure 13:
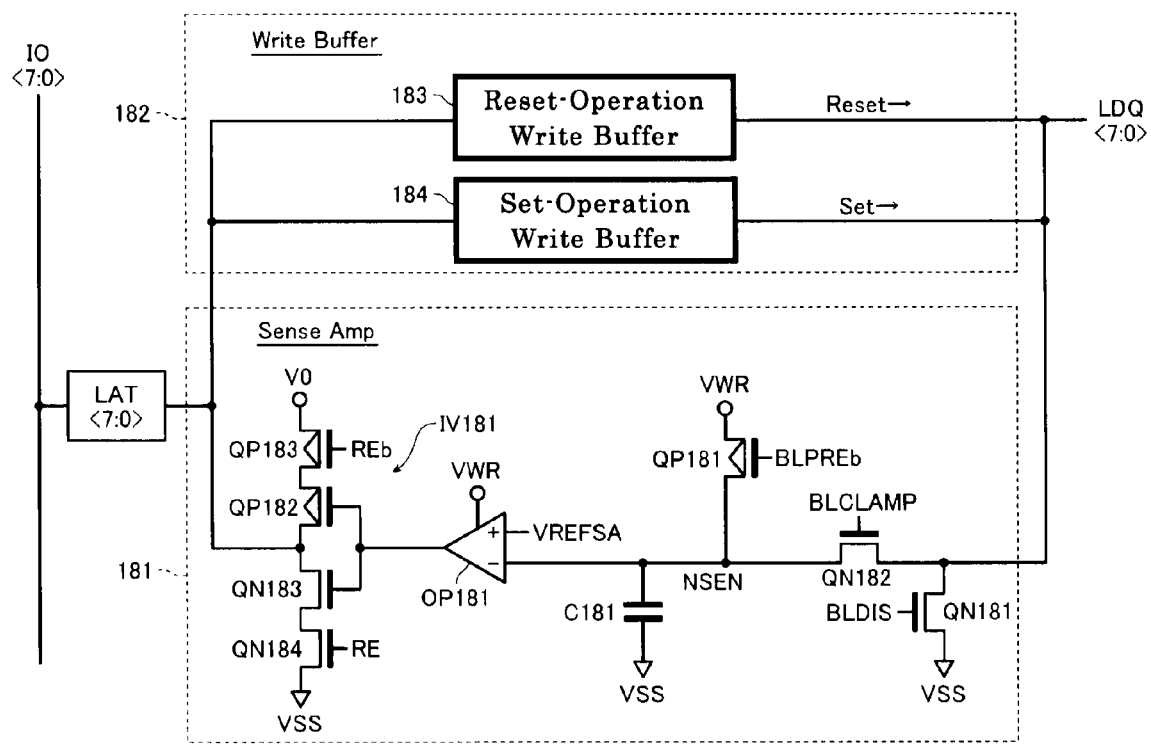
FIG. 13 is a circuit diagram of a column-system circuit of the semiconductor memory device according to the embodiment.

FIG. 13 is a circuit diagram of the sense amplifier/write buffer 180. The sense amplifier/write buffer 180 roughly includes a sense amplifier 181 and a write buffer 182.

The sense amplifier 181 is a circuit which transmits data of the memory cell MC appearing in the corresponding local data line LDQ <7:0> to a latch circuit LAT and a corresponding one of data input/output lines I/O <7:0>.

The sense amplifier 181 shown in FIG. 13 includes an NMOS transistor QN181, an NMOS transistor QN182 (clamping transistor), a PMOS transistors QP181, a capacitor C181, an operational amplifier OP181, and an inverter IV181. The NMOS transistor QN181 is provided between the local data line LDQ and the VSS terminal, and is controlled on the basis of control signals BLDIS. The NMOS transistor QN182 (clamping transistor) is provided between the local data line LDQ and the sense node NSEN, and is controlled on the basis of control signals BLCLAMP. The PMOS transistor QP181 is provided between the VWR terminal and the sense node NSEN, and is controlled on the basis of control signals BLPREb. The capacitor C181 is provided between the sense node NSEN and the VSS terminal. The operational amplifier OP181 compares the voltage of the sense node NSEN driven by the write voltage VWR with the reference voltage VREFSA. The inverter IV181 has an input terminal connected to the output terminal of the operational amplifier OP181, and an output terminal connected to the latch circuit LAT.

The transistor QN181 is turned on if the control signal BLDIS is "H," and thus helps discharge the voltage of the local data line LDQ. The transistor QN182 connects the sense node NSEN and the local data line LDQ to each other, and constrains the voltage of the local data line LDQ on the basis of the control signal BLCLAMP.

The transistor QP181 is turned ON if the control signal BLPREb is activated ("L"), and has a role of precharging the sense node NSEN. The charges in the sense node NSEN are discharged though the local data line LDQ to the bit lines BL if the transistors QN182 is turned ON. The discharging speed depends upon the resistance of the memory cell MC. Accordingly, the operational amplifier OP181 compares the potential of the sense node NSEN with the reference voltage VREFSA, and thereby the data in the selected memory cell MC is determined.

The inverter IV181 includes a PMOS transistor QP183 and an NMOS transistor QN183 connected in series to each other between the power-supply terminal V0 and the ground terminal VSS. The inverter IV181 is activated if the control signal RE="H" (REb="L"), and sends the output of the operational amplifier OP181 to the data latch LAT.

The write buffer 182 includes a reset-operation write buffer 183 and a set-operation write buffer circuit 184 for set/reset operation. The reset-operation write buffer 183 supplies a reset pulse to memory cells MC, and detects the states of memory cells MC when a reset operation is carried out. The set-operation write buffer circuit 184 for set operation supplies a set pulse to memory cells MC, and detects the states of memory cells MC when a set operation is carried out. More detail description is given later of the reset-operation write buffer 183 and the set-operation write buffer 184.

Next, description is given of a non-selected bit-line-voltage generator circuit 230 configured to generate a non-selected bit-line voltage VUB to be supplied to the column driver 170.

Figure 14:
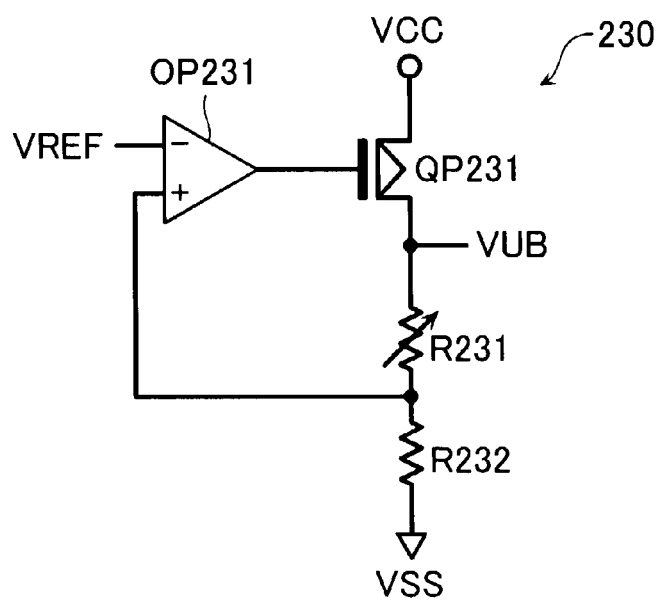
FIG. 14 is a circuit diagram of a column-system circuit of the semiconductor memory device according to the embodiment.

FIG. 14 is a circuit diagram of the non-selected bit-line-voltage generator circuit 230. The non-selected bit-line-voltage generator circuit 230 includes a PMOS transistor QP231, a variable resistor R231, and a fixed resistor R232, which are connected in series to one another between the VCC terminal and the VSS terminal. In addition, the non-selected bit-line-voltage generator circuit 230 includes an operational amplifier OP231. The voltage of the connection node of the resistors R231 and R232 is inputted into the non-inverting input terminal of the operational amplifier OP231 whereas a predetermined reference voltage VREF used to generate a non-selected-word-line voltage VUX is inputted into the non-inverting input terminal of the operational amplifier OP231. The output of the operational amplifier OP231 is inputted into the gate of the transistor QP231. In the non-selected bit-line-voltage generator circuit 230A, constant-voltage circuit is formed with the constituent elements described above. A non-selected-word-line voltage VUB is generated in the connection node of the transistor QP231 and the variable resistor R231 in the non-selected bit-line-voltage generator circuit 230.

<Write Buffer>

Next, description is given of the write buffer 182, but before that, description is given of a comparative example, i.e. a write buffer 382.

The write buffer 382 according to the comparative example has a function of detecting the transition of the state, in the reverse direction, of the memory cell MC when a set/reset operation is carried out.

Figure 21:
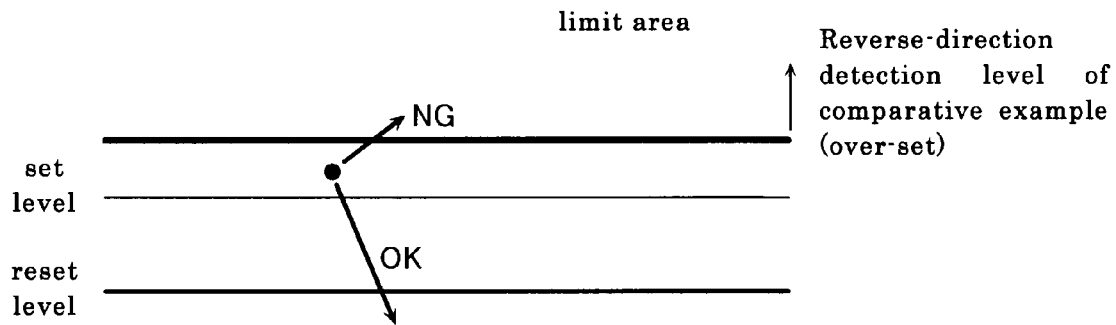
FIG. 21 is a conceptual diagram of a detection of reverse-direction operation at reset operation of the semiconductor memory device according to a comparative example.

FIG. 21 is a conceptual diagram of the function of detecting a reverse-direction operation by the write buffer 382 according to the comparative example when a reset operation is carried out.

In the comparative example, a reverse-direction detection level, which is shared by all the memory cells MC, is set at a level lower than the limit area that is higher than the set level. Accordingly, even if application of a reset pulse to a memory cell MC in the set state causes the state of the memory cell MC to transition in the set direction, the fact that the memory cell MC is undergoing an over-set operation can be detected before the state of the memory cell MC falls into the limit area, and thus such measures as the stopping of the application of the reset pulse can be taken.

Figure 22:
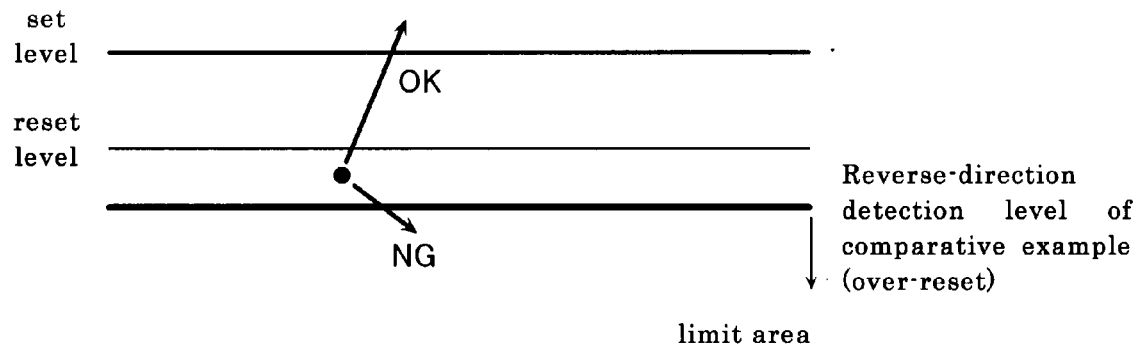
FIG. 22 is a conceptual diagram of a detection of reverse-direction operation at set operation of the semiconductor memory device according to the comparative example.

FIG. 22 is a conceptual diagram of the function of detecting a reverse-direction operation by the write buffer 382 according to the comparative example when a set operation is carried out.

In the same manner as the above, a reverse-direction detection level, which is shared by all the memory cells MC, is set at a level higher than the limit area that is lower than the reset level. Accordingly, even if the state of the memory cell MC undergoes an over-reset operation due to application of a set pulse, the fact that the memory cell MC is undergoing an over-set operation can be detected before the state of the memory cell MC falls into the limit area, and thus such measures as the stopping of the application of the reset pulse can be taken.

Figure 23:
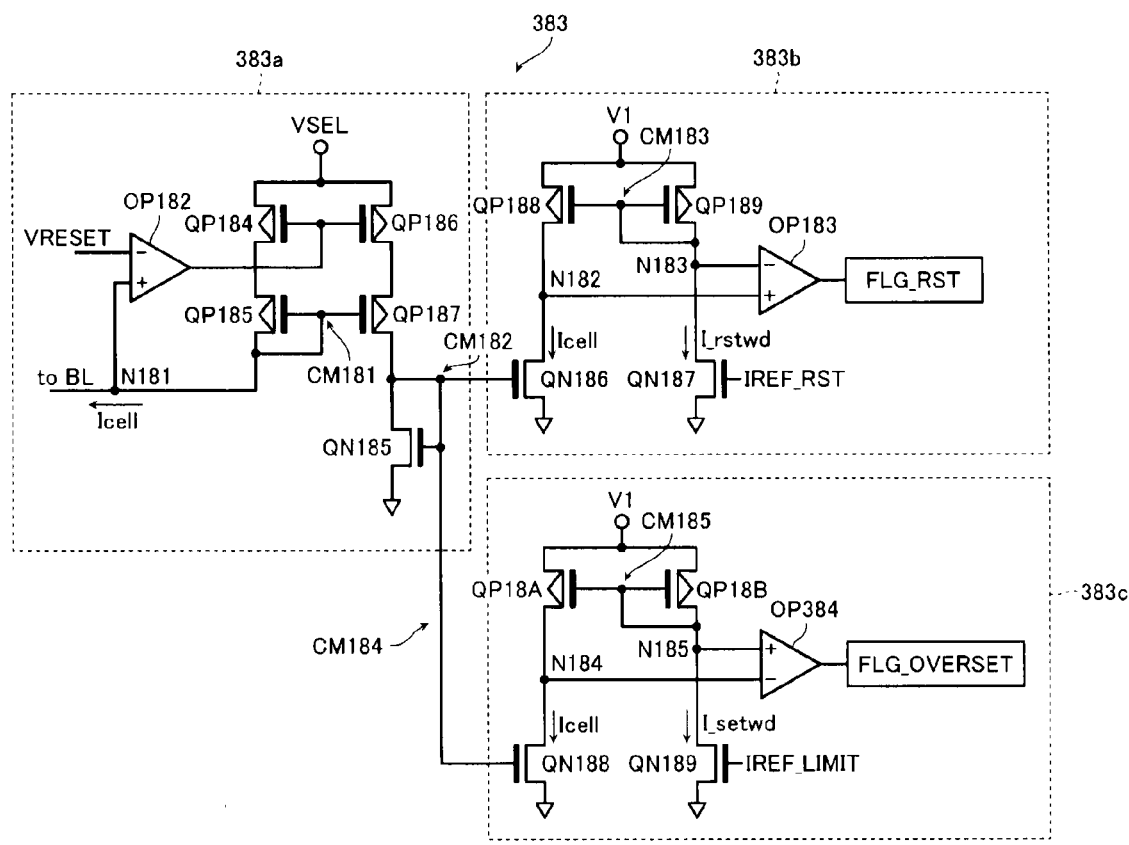
FIG. 23 is a circuit diagram of a reset-operation write buffer of the semiconductor memory device according to the comparative example.

FIG. 23 is a circuit diagram of a reset-operation write buffer 383 according to a comparative example. The reset-operation write buffer 383 implements the function to detect the reverse-direction operation shown in FIG. 21. Note that the following description concerns only the reset-operation write buffer 383, but a set operation write buffer can be implemented also by a configuration similar to that of the reset-operation write buffer 383.

The reset-operation write buffer 383 includes a reset-voltage supplier circuit 383a, a forward-direction-operation detector circuit 383b, and a reverse-direction-operation detector circuit 383c. The reset-voltage supplier circuit 383a supplies the bit lines BL with a reset-voltage needed for the reset operation. The forward-direction-operation detector circuit 383b detects the transition of the state of a memory cell MC that has been in the set state to the reset state. The reverse-direction-operation detector circuit 383c detects the transition, in the set direction, of the state of a memory cell MC that has been in the set state.

The reset-voltage supplier circuit 383a includes transistors QP184, QP185, QP186, QP187, and QN185. The transistors QP184 and QP185 are connected in series to each other between a node N181 and a VSEL terminal, to which a predetermined voltage VSEL is supplied. The transistors QP186, QP187, QN185 are connected in series to one another between the VSEL terminal and the ground line.

The output terminal of the operational amplifier OP182 is connected to the gates of the transistors QP184 and QP186. The operational amplifier OP182 controls the transistors QP184 and QP186 in accordance with the difference between the voltage of the node N181 and a voltage VRESET, which is a reference voltage for the reset-voltage. Thus, the reset-voltage supplier circuit 383a can supply stably the reset-voltage to the bit lines BL through the column decoder 160.

The transistors QP185 and QP187 together form a current mirror circuit CM181. In the current mirror circuit CM181, the side of the transistor QP185 is the input side and the side of the transistor QP187 is the output side. What is inputted into the current mirror circuit CM181 is a cell current Icell flowing through the memory cells MC.

The forward-direction-operation detector circuit 383b includes transistors QP188, QN186, QP189, and QN187. The transistors QP188 and QN186 are connected in series to each other between a V1 terminal, to which a predetermined voltage V1 is supplied, and the ground line. Likewise, the transistors QP 189 and QN187 are connected in series to each other between the V1 terminal and the ground line. In addition, the forward-direction-operation detector circuit 383b includes an operational amplifier OP183. A node N182 that exists between the transistors QP188 and QN186 is connected to the non-inverting input terminal of the operational amplifier OP183 whereas a node N183 that exists between the transistors QP189 and QN187 is connected to the inverting input terminal of the operational amplifier OP183. The output of the operational amplifier OP183 is a flag FLG_RST indicating that the state of the memory cell MC transitions properly to the set state.

The transistor QN186 together with the transistor QN185 of the reset-voltage supplier circuit 383a form a current mirror circuit CM182. In the current mirror circuit CM182, the side of the transistor QN185 is the input side while the side of the transistor QN186 is the output side. Thus, the cell current Icell flows through the forward-direction-operation detector circuit 383b via the current mirror circuit CM181.

The transistor QN187 serves as the current source of a reference current I_rstwd when a reference voltage IREF_RST is supplied to the gate of the transistor QN187. The reference current I_rstwd is a current equal to or larger than the cell current Icell flowing through the memory cells MC in the reset state, and is a current serving as a reference indicating that the state of a particular memory cell MC that has been in the set state transitions properly to the reset state.

The transistors QP188 and QP189 together form a current mirror circuit CM183, in which the side of transistor QP189 is the input side and the side of the transistor QP188 is the output side. Thus the node N182 has a voltage determined by the relative magnitudes of the reference current I_rstwd and the cell current Icell. Consequently, the output of the operational amplifier OP183, that is, the flag FLG_RST, becomes "H" provided that I_rstwd > Icell.

The reverse-direction-operation detector circuit 383c includes transistors QP18A, QN188, QP18B, and QN189. The transistors QP18A and QN188 are connected in series to each other between a V1 terminal and the ground line. Likewise, the transistors QP18B and QN189 are connected in series to each other between the V1 terminal and the ground line. The reverse-direction-operation detector circuit 383c also includes an operational amplifier OP384. In the operational amplifier OP384, a node N184 that exists between transistors QP18A and QN188 is connected to the non-inverting input terminal while a node N185 that exists between transistors QP18B and QN189 is connected to the non-inverting input terminal. The output of the operational amplifier OP384 is a flag FLG_OVERSET indicating that the state of a particular memory cell MC transitions in the set direction.

The transistor QN188 together with the transistor QN185 of the reset-voltage supplier circuit 383a form a current mirror circuit CM184. In the current mirror circuit CM184, the side of the transistor QN185 is the input side while the side of the transistor QN188 is the output side. Thus, the cell current Icell flows through the reverse-direction-operation detector circuit 383c via the current mirror circuit CM181.

The transistor QN189 serves as the current source of a reference current I_setwd when a reference voltage IREF_LIMIT is supplied to the gate of the transistor QN189. The reference current I_setwd is the cell current Icell in which the state of the memory cells MC transitions into the reverse-direction detection level, and is a current serving as a reference indicating the fact that a memory cell MC in a set state undergoes an over-set operation.

The transistors QP18A and QP18B together form a current mirror circuit CM185, in which the side of transistor QP18B is the input side and the side of the transistor QP18A is the output side. Thus the node N184 has a voltage determined by the relative magnitudes of the reference current I_setwd and the cell current Icell. Consequently, the output of the operational amplifier OP183, that is, the flag FLG_OVERSET, becomes "H" provided that I_setwd <Icell.

Figure 24:
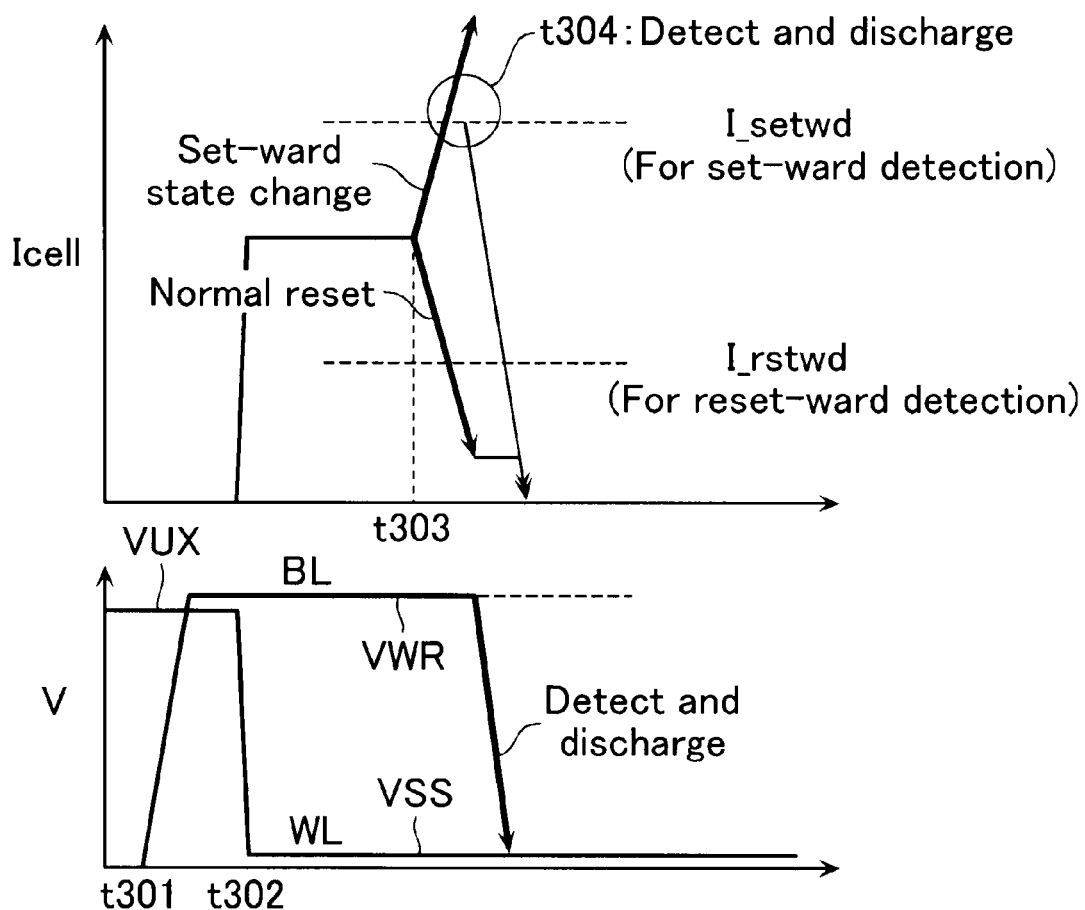
FIG. 24 is an operational waveform diagram at the time of reset operation of the semiconductor memory device according to the comparative example.

FIG. 24 shows operational waveforms of a semiconductor memory device according to a comparative example. The semiconductor memory device includes the reset-operation write buffer 383 and is carrying out a reset operation.

Before the reset operation, a non-selected-word-line voltage VUX is applied in advance to the selected word line WL.

At timing t301, a write voltage VWR is applied to the selected bit line BL.

At timing t302, the voltage of the selected word line WL is lowered from the non-selected-word-line voltage VUX down to selected-word-line voltage VSS. Thus, a forward-direction bias of "VWR-VSS" is created in the selected memory cell MC. While controlling the node N181 at a constant voltage, the reset-voltage supplier circuit 383a takes in the cell current Icell flowing through selected bit line BL.

At timing t303, the state of the selected memory cell MC that has been in the set state starts to transition.

If, for instance, the state of the selected memory cell MC transitions properly in the reset direction, the cell current Icell eventually becomes lower than the reference current I_rstwd to make the forward-direction-operation detector circuit 383b output a flag FLG_RST of "H." This means that the selected memory cell MC has transitioned to the reset state.

In contrast, if the state of the selected memory cell MC transitions in the set direction, the cell current Icell eventually becomes higher than the reference current I_setwd to make the reverse-direction-operation detector circuit 383c output a flag FLG_OVERSET of "H" (at timing t304). This means that the selected memory cell MC undergoes an over-set operation. In this case, the selected bit line BL is discharged by the sense amplifier QN181, and the application of the reset pulse is stopped.

As has been described, the use of the reset-operation write buffer 383 according to the comparative example can prevent a memory cell MC in the set state from falling into the limit area through an over-set operation.

However, different memory cells MC all of which are in the same set state may have different resistances of their respective variable resistive elements. Hence, if, in the case of the comparative example, a single reverse-direction detection level is commonly used for all the memory cells MC, the same degree of state transition in the reverse direction may allow successful detection of the reverse-direction operation for some of the memory cells MC, but not for the other memory cells MC.

Accordingly, in this embodiment, different reverse-direction detection levels are used appropriately for different memory cells MC to detect the reverse-direction operation.

Specifically, the cell current Icell before the application of the voltage pulse is stored as an initial cell current Icell0 (hereinafter, referred to as the "storing operation"), and a current of M-multiple of the initial cell current Icell0 (M is a positive real number) is used as each of the reference currents I_setwd and I_rstwd. This method has the following advantages over the comparative example.

Figure 15:
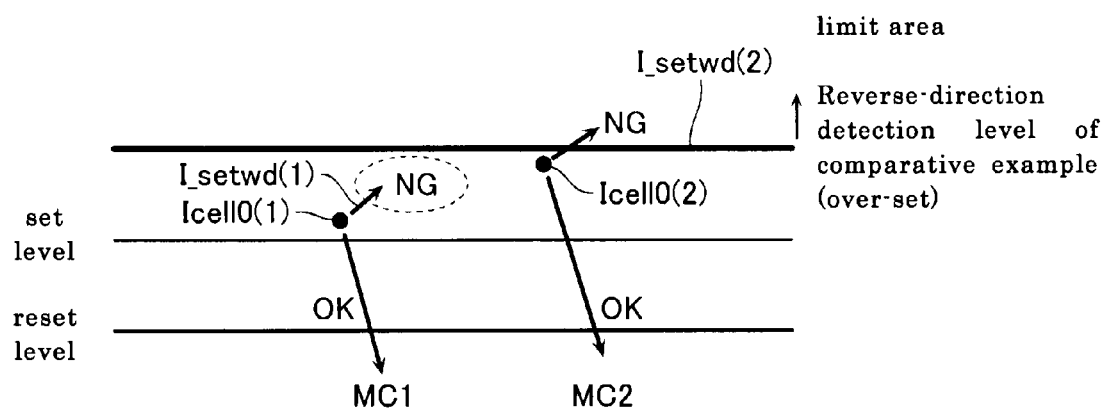
FIG. 15 is a conceptual diagram of a detection of reverse-direction operation at reset operation of the semiconductor memory device according to the embodiment.

For instance, when a variation in characteristics of an initial cell currents Icell0 between memory cells MC1 and MC2 is large, the over-set operation is occurred, as FIG. 15 shows.

In the comparative example, a single reverse-direction detection level is commonly used for the memory cells MC1 and MC2. The detection of the reverse-direction operation is possible for the memory cell MC2 whose state has reached the reverse-direction detection level through the over-set operation. For the memory cell MC1, however, the detection of over-set operation is impossible because, even through the over-set operation, the state of the memory cell MC1 does not reach the reverse-direction detection level, as shown by the dashed-line circle in FIG. 15.

In contrast, in this embodiment, a current of M-multiple of each of the initial cell currents Icell0(1) and Icell0(2) (e.g., M=1.1) of each of the memory cells MC1 and MC2 is used as each of the reference currents I_setwd (1) and I_setwd (2) (reverse-direction detection level). Accordingly, the detection of the over-set operation is possible irrespective of the difference in the initial cell current Icell0 between the memory cells MC1 and MC2.

Figure 16:
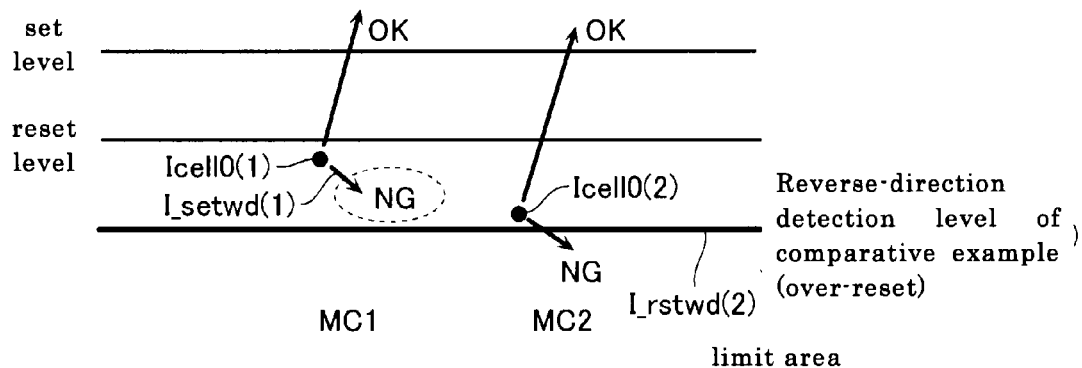
FIG. 16 is a conceptual diagram of a detection of reverse-direction operation at set operation of the semiconductor memory device according to the embodiment.

Now, when a variation in characteristics of an initial cell currents Icell0 between memory cells MC1 and MC2 is large, the over-reset operation is occurred as FIG. 16 shows.

Like the case shown in FIG. 15, the over-reset operation of the memory cell MC1 fails to be detected in the comparative example, as shown by the dashed-line circle in FIG. 16. In contrast, according to this embodiment, the detection of the over-reset operation is made possible by employing a current of M-multiple of the initial cell current Icell0(1) (e.g., M=0.9) as the reference current I_rstwd(1) (reverse-direction detection level).

As has been described, if the reverse-direction detection level is determined individually for each memory cell MC on the basis of the initial cell current of the memory cell MC as in the case of this embodiment, the detection of the reverse-direction operation is possible irrespective of the differences in the initial state among the memory cells MC. In addition if the above-mentioned constant M is made closer to 1, the reverse-direction operation can be detected immediately and the supply of the voltage pulse can be stopped in a shorter time.

Next, description is given of a write buffer 182 according to the embodiment that implements the detection of reverse-direction operation.

Figure 17:
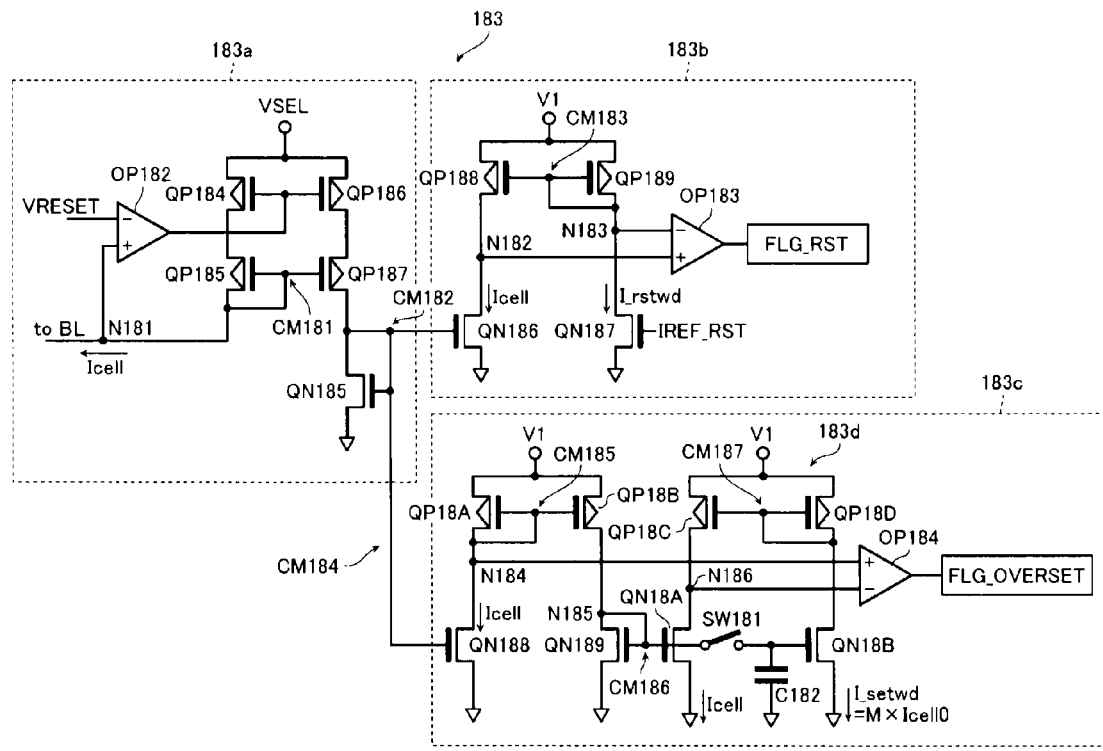
FIG. 17 is a circuit diagram of a reset-operation write buffer of the semiconductor memory device according to the embodiment.

FIG. 17 is a circuit diagram of the reset-operation write buffer 183 according to this embodiment. A constituent element of the reset-operation write buffer 183 is denoted by the same reference numeral used in FIG. 23 if the element is identical to the one of the reset-operation write buffer 383 according to the comparative example shown in FIG. 23.

The reset-operation write buffer 183 includes a reset-voltage supplier circuit 183a, a forward-direction-operation detector circuit 183b, and a reverse-direction-operation detector circuit 183c. The reset-voltage supplier circuit 183a supplies a reset-voltage needed for the reset operation. The forward-direction-operation detector circuit 183b detects the transition of the state of a memory cell MC that has been in the set state to the reset state. The reverse-direction-operation detector circuit 183c detects the occurrence of an over-set operation in a memory cell MC in the set state. The forward-direction-operation detector circuit 183b and the reverse-direction-operation detector circuit 183c together form a detector unit.

Among the components of the reset-operation write buffer 183, both the reset-voltage supplier circuit 183a and the forward-direction-operation detector circuit 183b have configurations that are identical respectively to the configurations of the reset-voltage supplier circuit 383a and the forward-direction-operation detector circuit 383b included in the reset-operation write buffer 383 according to the comparative example.

The reverse-direction-operation detector circuit 183c includes an initial-cell-current storage circuit 183d in comparison to the configuration of the reverse-direction-operation detector circuit 383 according to the comparative example.

The initial-cell-current storage circuit 183d includes transistors QP18C, QN18A, QP18D, and QN18B. The transistors QP18C and QN18A are connected in series to each other between a V1 terminal and the ground line. Likewise, the transistors QP18D and QN18B are connected in series to each other between the V1 terminal and the ground line. The transistor QN18A together with the transistor QN189 form a current mirror circuit CM186, in which the side of the transistor QN189 is the input side and the side of the transistor QN18A is the output side. The transistors QP18C and QP18D together form a current mirror circuit CM187, in which the side of the transistor QP18D is the input side and the side of the transistor QP18C is the output side. The gates of the transistors QN18B and QN18A are connected to each other via a switch SW181. The transistor QN18B and the transistor QN189 together form a current mirror circuit. Note that the mirror ratio of the transistor QN189 to the transistor QN18B is 1: M (e.g., M=1.1), and that a current of M×Icell flows through the transistor QN18B.

The initial-cell-current storage circuit 183d also includes a capacitor C182 to store the initial cell current. The capacitor C182 is provided between the ground line and the connection point of the gate of the transistor QN18B and the switch SW181.

The reverse-direction-operation detector circuit 183c includes an operational amplifier OP184 instead of the operational amplifier OP384 included in the reverse-direction-operation detector circuit 383c according to the comparative example. In the operational amplifier OP184, a node N184 is connected to the non-inverting input terminal, and the inverting input terminal is connected to a node N186 located between the transistors QP18C and QN18A. The operational amplifier OP184 outputs a flag FLG_OVERSET indicating that a memory cell MC carries out an over-set operation.

Next, description is given of a reset operation carried out by the semiconductor memory device using the reset-operation write buffer 183.

Figure 18:
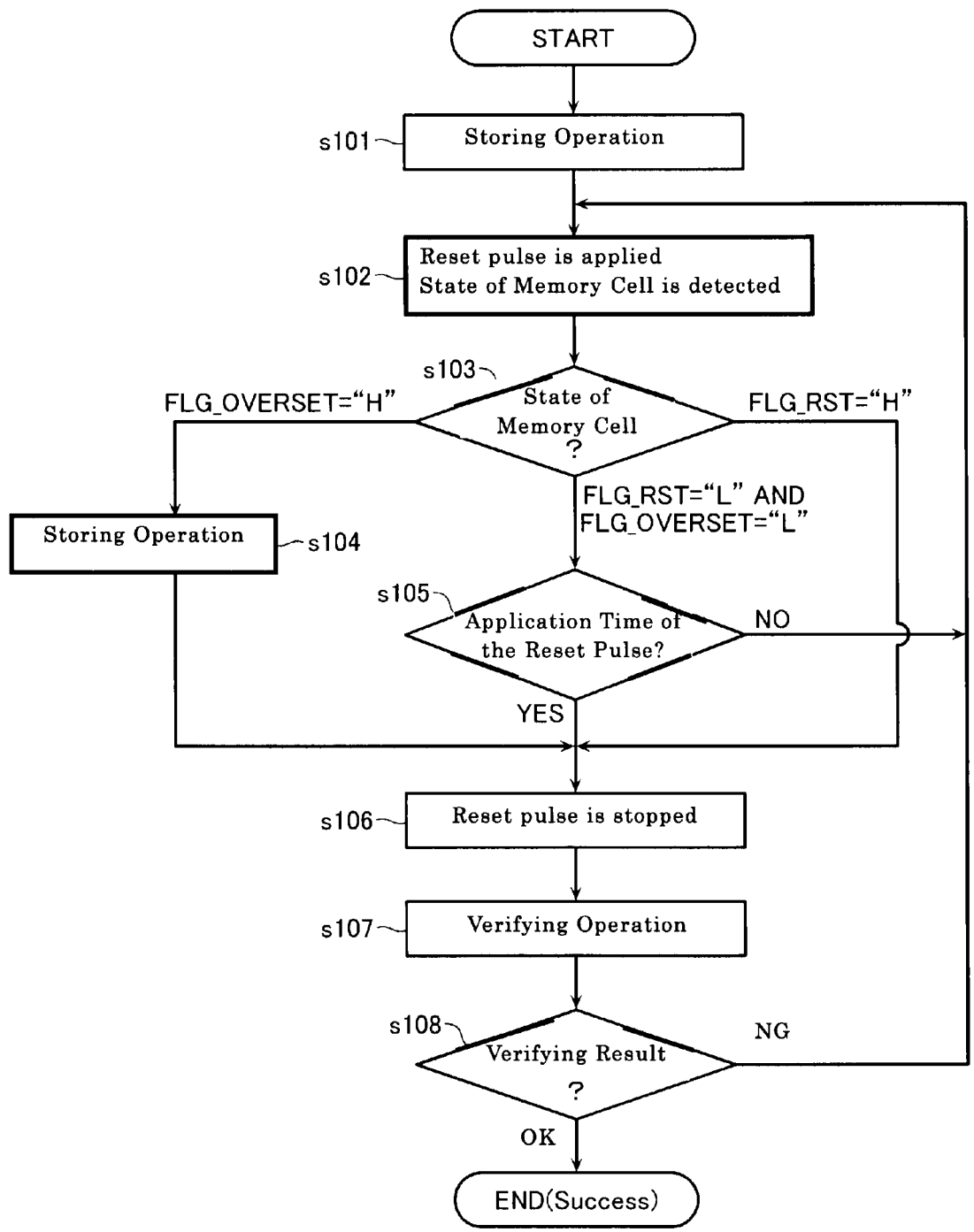
FIG. 18 is a flowchart of the reset operation by the semiconductor memory device according to the embodiment.
Figure 19:
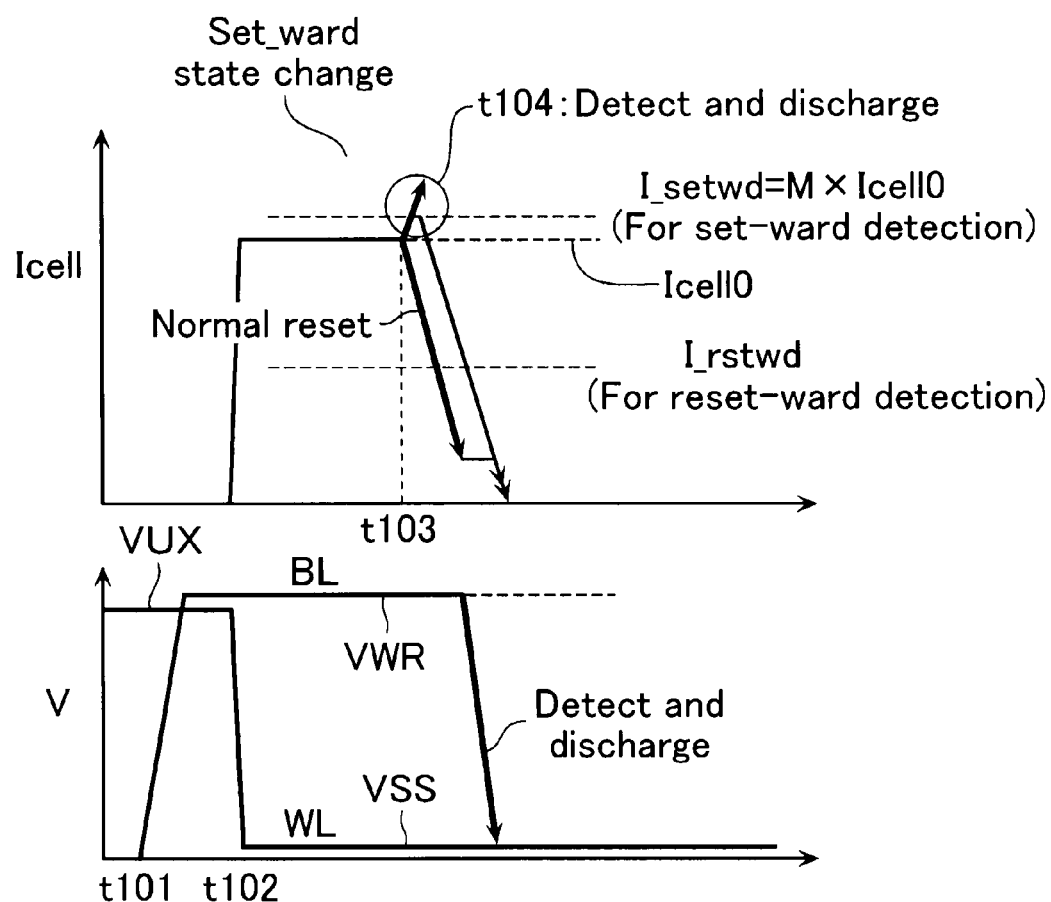
FIG. 19 is an operational waveform diagram at the time of reset operation of the semiconductor memory device according to the embodiment.

FIG. 18 is a flowchart of the reset operation carried out by the semiconductor memory device according to this embodiment. FIG. 19 is an operational-waveform diagram in the reset operation.

At step s101, the storing operation is performed. There are two ways of performing the storing operation:

(I) The voltage of the node N185 while the initial cell current Icell0 flowing immediately after the application of the reset pulse is sampled via the switch SW181 into the capacitor C182; or (II) In the case where plural cycles of application of the reset pulse are performed, the voltage of the node N185 at the time when the last cell current Icell flows in the last cycle of application of the reset pulse is sampled, via the switch SW181 into the capacitor C182, as the initial cell current Icell0 in the next cycle of application of the reset pulse.

Once the sampling is finished, the switch SW181 is turned OFF. Thus, a current of M×Icell0 flows through both of the transistors QP18D and QN18B.

At step s102, a reset pulse is applied to the memory cell MC, and the state of the memory cell MC is detected using the forward-direction-operation detector circuit 183c and the reverse-direction-operation detector circuit 183d. The reset pulse is applied in the following procedure. Firstly, the voltages of all the word lines WL are raised up to the non-selected-word-line voltage VUX (at timing t101 in FIG. 19). Then, the voltages of the selected bit lines BL are raised up to the write voltage VWR while the voltages of the selected word lines WL are lowered down to the selected-word-line voltage VSS (at timing t102 in FIG. 19).

When the reverse-direction operation is detected, the switch SW181 is kept in the OFF state. In this case, charges accumulated in the capacitor C182 are applied to the gate of the transistor QN18B. To put it differently, a voltage corresponding to the initial cell current Icell0 is applied to the gate of the transistor QN18B. Consequently, a reference current I_setwd corresponding to the initial cell current Icell0 flows through the transistor QN18B. Note that the reference current I_setwd is equal to M×Icell0. The constant M may be determined on the basis of the widths and the lengths of the gates of the transistors QN189 and QN18B. The reference current I_setwd flows through the transistor QP18C via the current mirror circuit CM187. In the meanwhile, the cell current Icell flows through the transistor QN18A via the current mirror circuits CM181 and CM184 to CM186.

At step s103, if the state of the memory cell MC transitions in the set direction (at timing t103 in FIG. 19), and the cell current exceeds the reference current I_setwd (=M×Icell0) (at timing t104 in FIG. 19), the flag FLG_OVERSET becomes "H." This means that the memory cell MC is carrying out an over-set operation. Accordingly, the application of the reset pulse is stopped immediately (at step s106).

Note that in the case (II) described above, a storing operation is carried out at step s104 before stopping the application of the reset pulse (at step s106), and thus the initial cell current Icell0 is updated to the cell current Icell of the moment. Accordingly, the over-set operation can be detected using an optimum reverse-direction detection level in the next application of the reset pulse.

Note that if the cell current Icell is in the limit area at this moment or is close to the limit area, the reset operation may be stopped without carrying out the next application of the reset pulse.

If the state of the memory cell MC gradually transitions in the reset direction and the cell current Icell falls down below the reference current I_rstwd, the flag FLG_RST becomes "H," This means that the memory cell MC transitions properly to the reset state. Accordingly, the application of the reset pulse is stopped (at step s106).

If none of the flags FLG_RST and FLG_OVERSET becomes "H", a determination is made concerning whether a predetermined application time period of the reset pulse is elapsed or not (at step s105). If the predetermined application time period is not yet elapsed, the processes at steps s102 and s103 are repeated. In contrast, if the predetermined application time period of the reset pulse is already elapsed, the application of the reset pulse is stopped (at step s106).

At step s107, a verifying operation is carried out on the memory cell MC.

At step s108, whether data is written in the memory cell MC properly or not is checked by referring to the verification result obtained at step s107. If data is written properly in the memory cell MC, the reset operation is finished. In contrast, if data is not written in the memory cell MC, the processes from step s102 onwards are repeatedly carried out.

Next, description is given of the set-operation write buffer 184.

Figure 20:
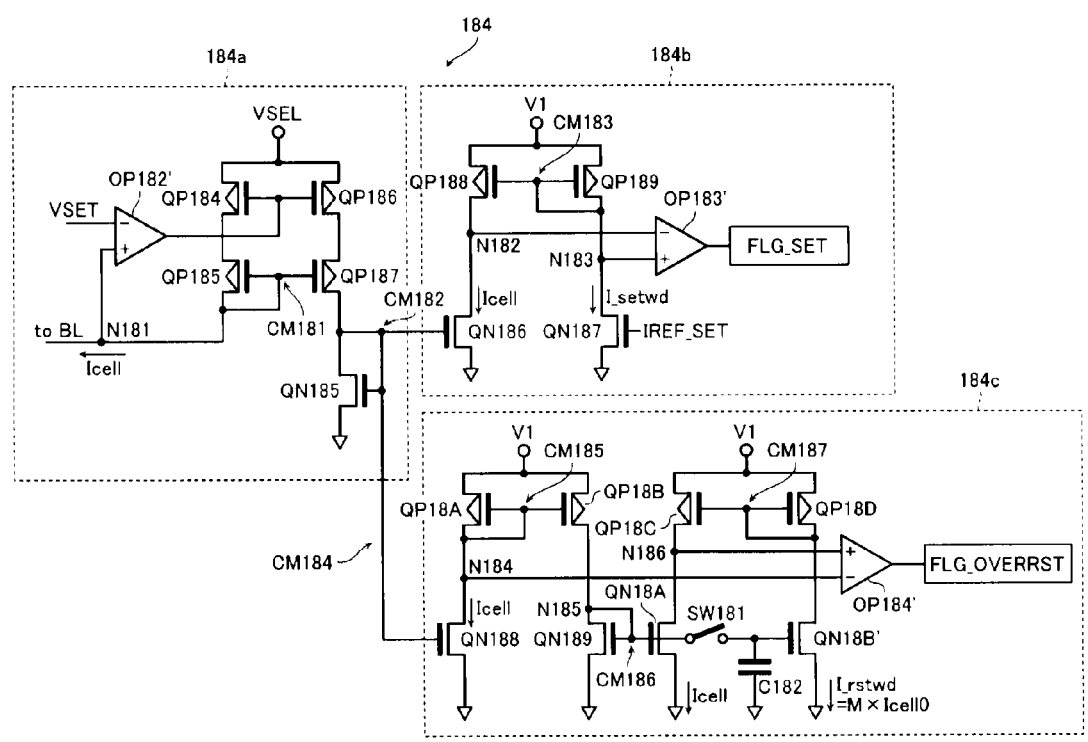
FIG. 20 is a circuit diagram of a set operation write buffer of the semiconductor memory device according to the embodiment.

FIG. 20 is a circuit diagram of the set-operation write buffer 184. A constituent element of the set-operation write buffer 184 is denoted by the same reference numeral used in FIG. 17 if the element is identical to the one of the reset-operation write buffer 183.

The set-operation write buffer 184 includes a set-voltage supplier circuit 184a, a forward-direction-operation detector circuit 184b, and a reverse-direction-operation detector circuit 184c. The set-voltage supplier circuit 184a supplies a set voltage in the set operation. The forward-direction-operation detector circuit 184b detects the transition of the state of a memory cell MC that has been in the reset state to the set state. The reverse-direction-operation detector circuit 184c detects the occurrence of an over-reset operation in a memory cell MC in the reset state.

The set-voltage supplier circuit 184a is basically identical to the reset-voltage supplier circuit 183a except that a reference voltage VSET for the set voltage is inputted into the non-inverting input terminal of an operational amplifier OP182' (corresponding to the operational amplifier OP182 of the reset-operation write buffer 183).

The forward-direction-operation detector circuit 184b is basically identical to the forward-direction-operation detector circuit 183b except the following points:

(A) The node N183 is connected to the non-inverting input terminal of an operational amplifier OP183' (corresponding to the operational amplifier OP183 of the reset-operation write buffer 183), and the node N182 is connected to the inverting input terminal; and (B) A predetermined reference voltage IREF_SET is applied to the gate of transistor QN187 so that a reference current I_setwd of the set level can flow through the transistor QN187.

With this circuit configuration, the operational amplifier OP183' outputs a flag FLG_SET indicating that the memory cell MC transitions from the reset state to the set state.

The reverse-direction-operation detector circuit 184c is basically identical to the reverse-direction-operation detector circuit 183c except the following points:

(A) The node N186 is connected to the non-inverting input terminal of an operational amplifier OP184' (corresponding to the operational amplifier OP184 of the reset-operation write buffer 183), and the node N184 is connected to the inverting input terminal; and (B) A constant M is set at such a value that a reference current I_rstwd of the reverse-direction detection level can flow through a transistor QN18B' (corresponding to the transistor QN18B of the set operation write buffer 183).

With this circuit configuration, the operational amplifier OP184' outputs a flag FLG_OVERRST indicating that the memory cell MC in the reset state performs the over-reset operation.

With the above-described set-operation write buffer 184, the over-reset operation of the memory cell MC can be detected at a point of time when the cell current Icell falls down below the level of M×Icell0.

According to the embodiment described, since the reverse-direction detection level is set on the basis of the initial cell current of each memory cell MC, an optimum control of the memory cells MC can be done individually for each memory cell MC in case of the over-set operation or of the over-reset operation. Consequently, the reverse-direction operation can be detected immediately irrespective of the differences in the state among the memory cells MC, so that the memory cells MC can be made more reliable. In addition, the reverse-direction operation, if occurs, of a memory cell MC can be prevented from being prolonged. Accordingly, the processing associated with each data-write operation can be done in a shorter length of time.

<Others>

An embodiment of the invention has been described, but the invention is not restricted by the embodiment. Various modifications and additions can be made without departing the scope of the invention.

What is claimed is:

1. A semiconductor memory device comprising:
a memory-cell array that includes a first line, a second line intersecting the first line, and a memory cell including a variable resistive element provided in the intersection of the first and the second lines;
a data-write unit configured to apply a voltage pulse to the memory cell through the first and the second lines, the voltage pulse to set and/or reset data; and
a detector unit configured to compare a cell current that flows through the memory cell by the voltage pulse at the time of setting and/or resetting the data with a reference current generated from an initial value of the cell current, and to control the data-write unit in accordance with a result of comparison,
wherein the data-write unit repeatedly applies the voltage pulse to the memory cell until data is set and/or reset, and
the reference current is generated from the cell current that flows through the memory cell in a previous voltage pulse which immediately precedes the voltage pulse.

2. The semiconductor memory device according to claim 1, wherein
the detector unit stops the application of the voltage pulse by the data-write unit in accordance with the result of comparison of the cell current and the reference current.

3. The semiconductor memory device according to claim 1, wherein
the detector unit includes:
a cell-current input unit including a current mirror circuit configured to receive an input through a current path connected to the memory cell;
a current storage circuit configured to store an initial value of the cell current inputted by the cell-current input unit; and
a current comparator circuit configured to compare the cell current inputted by the cell-current input unit with the reference current corresponding to the initial value of the cell current stored in the current storage circuit.

4. The semiconductor memory device according to claim 3, wherein
the current storage circuit includes a capacitor configured to keep, as the initial value of the cell current, a gate voltage of the current mirror circuit through which the cell current flows.

5. A semiconductor memory device comprising:
a memory-cell array including a plurality of first lines, a plurality of second lines intersecting the plurality of first lines, and a plurality of memory cells each including a variable resistive element, the variable resistive element provided in each intersection of the plurality of first lines and the plurality of second lines;
a data-write unit configured to apply a voltage pulse to a selected one of the memory cells through the plurality of first lines and the plurality of second lines, the voltage pulse to set and/or reset data; and a detector unit configured to set a reverse-direction detection level on the basis of a cell current flowing through the memory cell selected with the voltage pulse at a time of setting and/or resetting data, and a reference current generated from an initial value of the cell current, the reverse-direction detection level being to be used to detect transition of the memory cell in a reverse direction at the time of setting and/or resetting, and configured to control the data-write unit to stop the e voltage pulse by the data-write unit if the cell current flowing through the memory cell exceeds the reverse-direction detection level.

6. The semiconductor memory device according to claim 5, wherein
at least two of the memory cells have different reference currents from each other.

7. The semiconductor memory device according to claim 5, wherein
the data-write unit repeatedly applies the voltage pulse to the memory cell until data is set and/or reset, and
the reference current is generated from the cell current that flows through the memory cell in a previous voltage pulse which immediately precedes the voltage pulse.

8. The semiconductor memory device according to claim 5, wherein
the detector unit includes:
a cell-current input unit including a current mirror circuit configured to receive an input through a current path connected to the memory cell as an input;
a current storage circuit configured to store an initial value of the cell current inputted by the cell-current input unit; and
a current comparator circuit configured to compare the cell current inputted by the cell-current input unit with the reference current corresponding to the initial value of the cell current stored in the current storage circuit.

9. The semiconductor memory device according to claim 8, wherein
the current storage circuit includes a capacitor configured to keep, as the initial value of the cell current, a gate voltage of the current mirror circuit through which the cell current flows.

10. A semiconductor memory device comprising:
a memory-cell array including a plurality of first lines, a plurality of second lines intersecting the plurality of first lines, and a plurality of memory cells each including a variable resistive element, the variable resistive element provided in each intersection of the plurality of first lines and the plurality of second lines;
a data-write unit configured to apply a voltage pulse to a selected memory cell which is one of the plurality of the memory cells through an one of the plurality of first lines and an one of the plurality of second lines, the voltage pulse to set and/or reset data; and
a detector unit configured to control the data-write unit, wherein
the detector unit performs:
a first step of sampling a reference current flowing through the selected memory cell during the application of the voltage pulse;
a second step of detecting a state of the selected memory cell during the application of the voltage pulse; and
a third step of controlling the data-write unit to stop the voltage pulse by the data-write unit if the memory cell selected at the second step is judged to be in an over-set and/or over-reset state.

11. The semiconductor memory device according to claim 10, wherein
after an application time period is elapsed at the second step, the detector unit stops the application of the voltage pulse by the data-write unit.

12. The semiconductor memory device according to claim 11, wherein
the detector unit further performs a fourth step of verifying the selected memory cell, and returning to the second step if a data is not written in the selected memory cell.

13. The semiconductor memory device according to claim 12, wherein
the detector circuit includes a forward-direction-operation detector circuit and a reverse-direction-operation detector circuit, and
at the second step, the forward-direction-operation detector circuit and the reverse-direction-operation detector circuit compare the reference current with a cell current of the selected memory cell.

14. The semiconductor memory device according to claim 13, wherein
before the third step, the detector unit further performs a fifth step of updating the reference current to the cell current detected at the second step.

15. The semiconductor memory device according to claim 10, wherein
the detector circuit includes a forward-direction-operation detector circuit and a reverse-direction-operation detector circuit.

16. The semiconductor memory device according to claim 15, wherein
at the second step, the forward-direction-operation detector circuit and the reverse-direction-operation detector circuit compare the reference current with the cell current of the selected memory cell.

17. A semiconductor memory device comprising:
a memory-cell array that includes a first line, a second line intersecting the first line, and a memory cell including a variable resistive element provided in the intersection of the first and the second lines;
a data-write unit configured to apply a voltage pulse to the memory cell through the first and the second lines, the voltage pulse to set and/or reset data; and
a detector unit configured to compare a cell current that flows through the memory cell by the voltage pulse at the time of setting and/or resetting the data with a reference current generated from an initial value of the cell current, and to control the data-write unit in accordance with a result of comparison,
wherein the detector unit includes:
a cell-current input unit including a current mirror circuit configured to receive an input through a current path connected to the memory cell;
a current storage circuit configured to store an initial value of the cell current inputted by the cell-current input unit; and
a current comparator circuit configured to compare the cell current inputted by the cell-current input unit with the reference current corresponding to the initial value of the cell current stored in the current storage circuit.

18. The semiconductor memory device according to claim 17, wherein
the detector unit stops the application of the voltage pulse by the data-write unit in accordance with the result of comparison of the cell current and the reference current.

19. The semiconductor memory device according to claim 17, wherein the current storage circuit includes a capacitor configured to keep, as the initial value of the cell current, a gate voltage of the current mirror circuit through which the cell current flows.

* * * * *